(12) United States Patent
Lee et al.

(10) Patent No.: US 10,110,248 B2
(45) Date of Patent: Oct. 23, 2018

(54) DELTA MODULATOR WITH VARIABLE FEEDBACK GAIN, ANALOG-TO-DIGITAL CONVERTER INCLUDING THE DELTA MODULATOR, AND COMMUNICATION DEVICE INCLUDING THE DELTA MODULATOR

(71) Applicant: SAMSUNG ELECTRONICS CO., LTD., Suwon-si (KR)

(72) Inventors: Jae-hoon Lee, Suwon-si (KR); Jong-woo Lee, Seoul (KR); Chilun Lo, Seongnam-si (KR); Seung-hyun Oh, Seoul (KR); Jong-mi Lee, Pohang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/702,962

(22) Filed: Sep. 13, 2017

(65) Prior Publication Data
US 2018/0219559 A1 Aug. 2, 2018

(30) Foreign Application Priority Data
Jan. 31, 2017 (KR) .................. 10-2017-0014111

(51) Int. Cl.
*H03M 3/00* (2006.01)

(52) U.S. Cl.
CPC .......... *H03M 3/464* (2013.01); *H03M 3/426* (2013.01); *H03M 3/436* (2013.01); *H03M 3/498* (2013.01)

(58) Field of Classification Search
CPC ...... H03M 3/454; H03M 3/464; H03M 3/456; H03M 3/424; H03M 3/436; H03M 3/30; H03M 1/12; H03M 3/458

USPC ................. 341/118, 120, 143, 172
See application file for complete search history.

(56) References Cited

U.S. PATENT DOCUMENTS

| | | | | |
|---|---|---|---|---|
| 5,305,004 A | * | 4/1994 | Fattaruso | ............ H03M 1/0673 |
| | | | | 341/120 |
| 5,995,036 A | | 11/1999 | Nise | |
| 6,037,887 A | * | 3/2000 | Wu | ........................ H03M 3/486 |
| | | | | 341/139 |
| 6,674,381 B1 | * | 1/2004 | Gomez | ................. H03M 3/328 |
| | | | | 341/143 |
| 7,221,303 B1 | | 5/2007 | Melanson | |

(Continued)

FOREIGN PATENT DOCUMENTS

KR  10-1248485 B1  4/2013
KR  10-1435980 B1  9/2014

*Primary Examiner* — Linh Nguyen
(74) *Attorney, Agent, or Firm* — Sughrue Mion, PLLC

(57) ABSTRACT

A variable feedback gain delta modulator includes group of capacitors commonly connected to a first terminal and are respectively classified into a first capacitor group and a second capacitor group; a comparator for sequentially generating n-bit digital output signals based on a voltage of the first terminal; and a switch group including switches respectively connected to the capacitors, wherein the switches are respectively classified into a first switch group and a second switch group respectively connected to the first capacitor group and the second capacitor group, and the first switch group and the second switch group respectively operate according to a first control signal and a second control signal that are determined based on the n-bit digital output signals and the variable feedback gain.

20 Claims, 17 Drawing Sheets

(56) References Cited

U.S. PATENT DOCUMENTS

| | | | |
|---|---|---|---|
| 7,777,663 B2 | 8/2010 | Akizuki | |
| 7,880,654 B2* | 2/2011 | Oliaei | H03M 3/374 |
| | | | 341/143 |
| 8,659,461 B1 | 2/2014 | Zhu | |
| 8,928,511 B2 | 1/2015 | Lin | |
| 8,963,754 B2 | 2/2015 | Morgado | |
| 9,019,140 B2 | 4/2015 | Zhao | |
| 9,385,740 B2 | 7/2016 | Wang | |
| 2005/0052299 A1* | 3/2005 | Oliaei | H03M 3/344 |
| | | | 341/143 |
| 2006/0267823 A1* | 11/2006 | Pinna | H03M 3/332 |
| | | | 341/143 |
| 2008/0062024 A1* | 3/2008 | Maeda | H03M 3/374 |
| | | | 341/143 |
| 2015/0102951 A1* | 4/2015 | Watanabe | H03M 3/374 |
| | | | 341/143 |
| 2015/0194981 A1* | 7/2015 | Tang | H03M 1/442 |
| | | | 341/172 |
| 2016/0173121 A1* | 6/2016 | Doare | H03M 3/378 |
| | | | 341/120 |
| 2016/0191072 A1 | 6/2016 | Rath | |
| 2016/0233872 A1* | 8/2016 | Wei | H03M 3/37 |

* cited by examiner

DELTA MODULATOR WITH VARIABLE FEEDBACK GAIN, ANALOG-TO-DIGITAL CONVERTER INCLUDING THE DELTA MODULATOR, AND COMMUNICATION DEVICE INCLUDING THE DELTA MODULATOR

CROSS-REFERENCE TO RELATED APPLICATION

This application claims priority from Korean Patent Application No. 10-2017-0014111, filed on Jan. 31, 2017 in the Korean Intellectual Property Office, the disclosure of which is incorporated herein by reference in its entirety.

BACKGROUND

Methods and apparatuses consistent with example embodiments relate to a communication device, and more particularly, to a delta modulator with a variable feedback gain, an analog-to-digital converter including the delta modulator, and a communication device including the delta modulator.

An analog-to-digital converter converts an analog input signal into a digital output signal. A wireless communication system uses an analog-to-digital converter to convert a received radio frequency (RF) signal into a baseband signal and generate a digital output signal based on an analog baseband signal. Examples of the analog-to-digital converter may include a flash-type analog-to-digital converter, a Successive Approximation Register (SAR)-type analog-to-digital converter, a sigma delta analog-to-digital converter, and the like, and each type may be used in a field according to the characteristics thereof. The flash-type analog-to-digital converter has fast operation speed, but includes $2^n$ comparators to provide n-bit digital output signals. Thus, the flash-type analog-to-digital converter consumes a large amount of power and has a large implementation area. Compared with the flash-type analog-to-digital converter, the SAR-type analog-to-digital converter has low operation speed, but includes only one comparator. Thus, the SAR-type analog-to-digital converter consumes a small amount of power and has a small implementation area. The sigma delta analog-to-digital converter has a high signal-to-noise ratio (SNR), but a feedback gain of a delta modulator including passive elements is fixed to 1.

SUMMARY

According to an aspect of an example embodiment, there is provided a delta modulator including: a capacitor group including a plurality of capacitors that are commonly connected to a first terminal, wherein the plurality of capacitors are respectively classified into a first capacitor group and a second capacitor group such that the delta modulator has a variable feedback gain; a comparator configured to sequentially generate n-bit digital output signals based on a first terminal voltage of the first terminal, n being a positive integer; and a switch group including a plurality of switches that are respectively connected to the plurality of capacitors. The plurality of switches are respectively classified into a first switch group and a second switch group that are respectively connected to the first capacitor group and the second capacitor group, and the first switch group and the second switch group are configured to respectively operate according to a first control signal and a second control signal that are determined based on the n-bit digital output signals and the variable feedback gain.

According to an aspect of another example embodiment, there is provided an analog-to-digital converter configured to convert an analog input signal into a digital output signal, the analog-to-digital converter including: a delta modulator configured to receive the analog input signal in a sampling phase and output the digital output signal in a conversion phase, the delta modulator having a variable feedback gain, the delta modulator including: a capacitor group including a plurality of capacitors that are commonly connected to a first terminal, the plurality of capacitors being respectively classified into a first capacitor group and a second capacitor group such that the delta modulator has the variable feedback gain; a comparator configured to sequentially generate the digital output signal based on a voltage of the first terminal, the digital output signal having n bits, wherein n is a positive integer; and a switch group including a plurality of switches respectively connected to the plurality of capacitors, wherein the plurality of switches are respectively classified into a first switch group and a second switch group that are respectively connected to the first capacitor group and the second capacitor group, and the first switch group and the second switch group are configured to respectively operate according to a first control signal and a second control signal that are determined based on the digital output signal and the variable feedback gain.

According to an aspect of yet another example embodiment, there is provided a communication device including: an analog-to-digital converter configured to convert an analog input signal into a digital output signal based on a reference voltage and including a delta modulator having a variable feedback gain; and a reference voltage generator configured to generate and apply the reference voltage to the analog-to-digital converter at a reference voltage level, the reference voltage generator being further configured to determine a level of the reference voltage based on the variable feedback gain and maintain the level of the reference voltage in a sampling phase and a conversion phase.

According to an aspect of still yet another example embodiment, there is provided a delta modulator including: a first capacitor group including a first plurality of capacitors commonly connected to a first terminal; a second capacitor group including a second plurality of capacitors commonly connected to the first terminal; a first switch group including a first plurality of switches which respectively correspond to the first plurality of capacitors; a second switch group including a second plurality of switches which respectively correspond to the second plurality of capacitors; a first controller configured to generate, based on a first-n-bit digital output signal, a first control signal configured to control the first switch group and a second control signal configured to control the second switch group; and a comparator configured to sequentially generate the first n-bit digital output signal based on a first voltage level of the first terminal.

BRIEF DESCRIPTION OF THE DRAWINGS

Example embodiments will be more clearly understood from the following detailed description taken in conjunction with the accompanying drawings in which.

DETAILED DESCRIPTION OF EXAMPLE EMBODIMENTS

Figure 1:
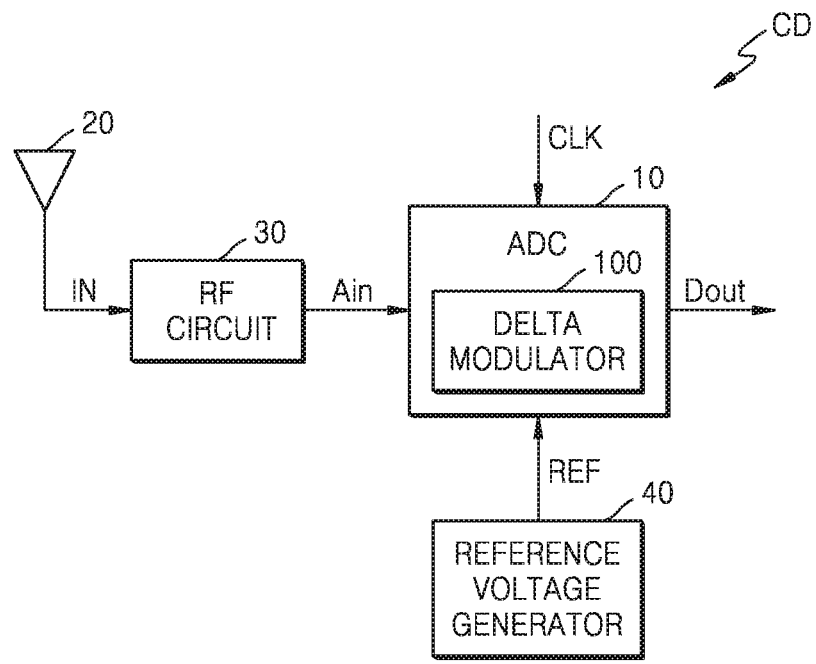
FIG. 1 is a block diagram of a communication device according to an example embodiment.

FIG. 1 is a block diagram of a communication device (CD) according to an example embodiment.

Referring to FIG. 1, the CD may include an analog-to-digital converter (ADC) 10, an antenna 20, a radio frequency (RF) circuit 30, and a reference voltage generator 40. In an example embodiment, the CD may denote a reception terminal that receives various pieces of information. However, example embodiments are not limited thereto. In some example embodiments, the CD may denote a transmission terminal that transmits various pieces of information, or a transceiver that performs both a reception function and a transmission function. Respective components included in the CD may be implemented using hardware blocks, such as analog circuits and/or digital circuits, or software blocks such as instructions executed by a processor, etc.

The RF circuit 30 may receive an RF signal IN through the antenna 20 and may generate a baseband signal by performing down-conversion on the received RF signal IN. The baseband signal may be referred to as an analog input signal Ain. In an example embodiment, the RF circuit 30 may generate the analog input signal Ain by performing direct conversion so that the RF signal IN is directly converted into a baseband signal. In an example embodiment, the RF circuit 30 may convert the RF signal IN into an Intermediated Frequency (IF) signal and may generate the analog input signal Ain by performing 2-step down conversion so that the IF signal is converted into the baseband signal.

The ADC 10 may receive the analog input signal Ain and may convert the received analog input signal Ain into a digital output signal Dout. In the present example embodiment, the ADC 10 may include a delta modulator 100 having a variable feedback gain. For example, the feedback gain may be adaptively adjusted according to a frequency of a clock signal CLK. When the frequency of the clock signal CLK is high, the feedback gain decreases, and when the frequency of the clock signal CLK is low, the feedback gain increases, thereby determining an optimum gain. The clock signal CLK may include a sampling phase and a conversion phase. The clock signal CLK will be described in detail below with reference to FIG. 5.

The reference voltage generator 40 may generate a reference voltage REF and may provide the generated reference voltage REF to the ADC 10. A level of the reference voltage REF may change according to the feedback gain of the delta modulator 100. For example, when the feedback gain is less than or equal to 1, the reference voltage REF has a first voltage level, and when the feedback gain is greater than 1, the reference voltage REF may have a second voltage level. In this case, the second voltage level may correspond to the first voltage level multiplied by the feedback gain. Also, the level of the reference voltage REF may remain uniform in a sampling phase and a conversion phase of the delta modulator 100. Accordingly, the CD may not include reference voltage generators to implement the delta modulator 100 having the variable feedback gain, and accordingly, an amount of power consumed by the CD and an implementation area thereof may decrease.

Figure 2:
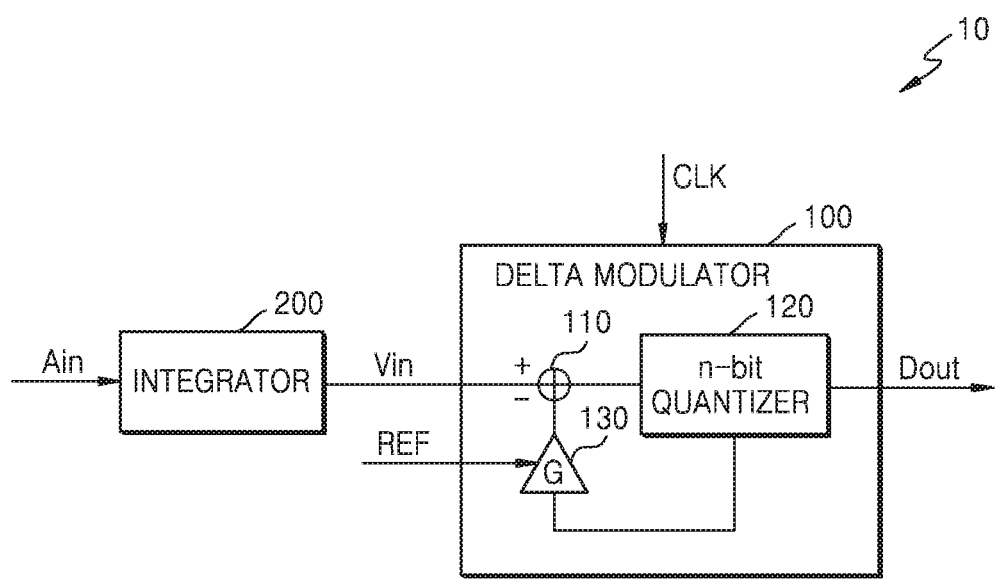
FIG. 2 is a detailed block diagram of an analog-to-digital converter according to an example embodiment.

FIG. 2 is a detailed block diagram of the ADC 10 of FIG. 1.

Referring to FIG. 2, the ADC 10 may be a sigma delta ADC and may include the delta modulator 100 and an integrator 200. The integrator 200 may receive the analog input signal Ain and may generate an input voltage Vin by integrating the analog input signal Ain. In this case, the input voltage Vin may be an analog input voltage. The delta modulator 100 may generate the digital output signal Dout based on the input voltage Vin. However, example embodiments are not limited thereto, and may be applied to an arbitrary ADC including the delta modulator 100.

The delta modulator 100 may include a subtractor 110, a quantizer 120, and an amplifier 130. The subtractor 110 may subtract an output of the amplifier 130 from the input voltage Vin in the sampling phase of the clock signal CLK. The quantizer 120 may quantize the output of the subtractor 110 to output the digital output signal Dout in the conversion phase of the clock signal CLK, and in this case, the digital output signal Dout may be an n-bit signal (where n is a positive integer). The quantizer 120 may be a multi-bit quantizer and may be connected to the amplifier 130 through one feedback path. The amplifier 130 may use the reference voltage REF and thus may amplify an output of the quantizer 120 by a feedback gain G. When the feedback gain G is determined, the level of the reference voltage REF may remain uniform in the sampling phase and the conversion phase of the clock signal CLK.

In an example embodiment, a level of the reference voltage REF applied when the feedback gain G is greater than 1 may be higher than a level of the reference voltage REF applied when the feedback gain G is less than or equal to 1. Accordingly, when the feedback gain G is greater than 1, a subtraction amount of the subtractor 110 may increase. In an example embodiment, the level of the reference voltage REF applied when the feedback gain G is less than 1 may be identical to the level of the reference voltage REF applied when the feedback gain G is equal to 1. When the feedback gain G is less than 1, only some of capacitors forming the subtractor 110 may be used to decrease the subtraction amount of the subtractor 110. Descriptions in this regard will be provided below with reference to FIG. 4.

Figure 3:
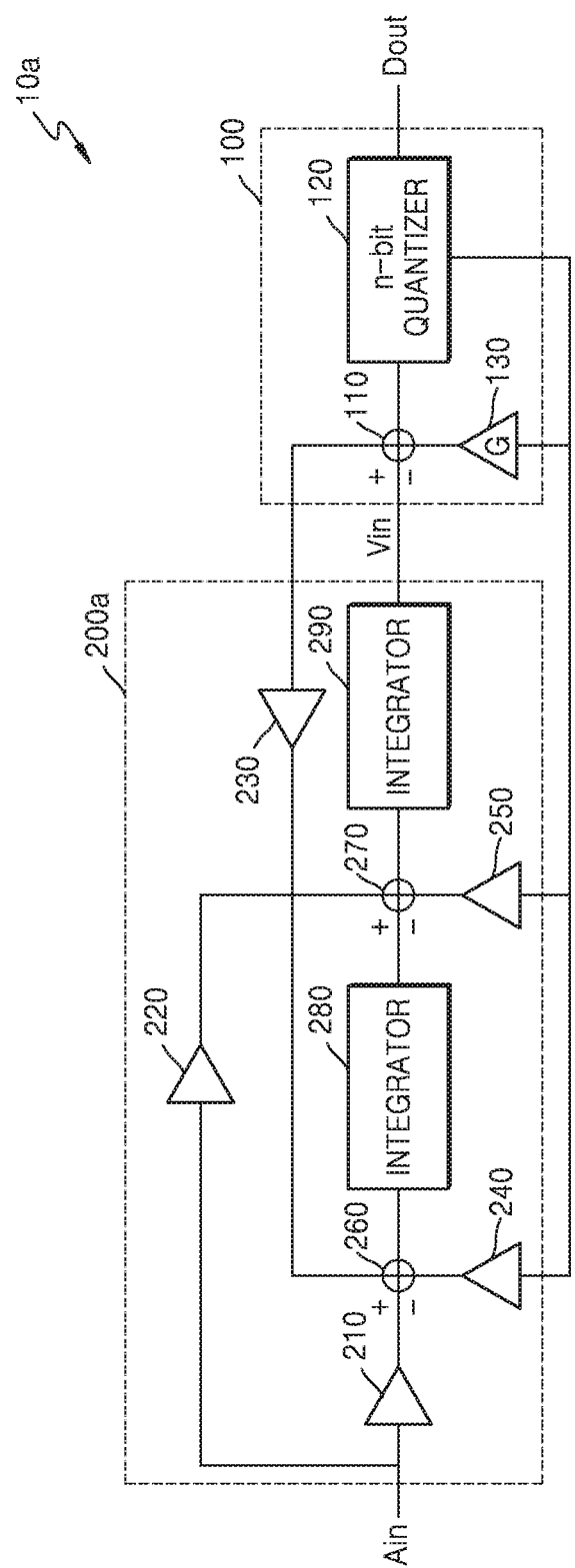
FIG. 3 is a block diagram of an analog-to-digital converter according to an example embodiment.

FIG. 3 is a block diagram of an ADC 10 according to an example embodiment.

Referring to FIG. 3, an ADC 10a may include the delta modulator 100 and an integral block 200a. The delta modulator 100 may include the subtractor 110, the quantizer 120, and the amplifier 130. The integral block 200a may be embodied as a second-order integrator including amplifiers 210 to 250, first and second subtractors 260 and 270, and first and second integrators 280 and 290. However, example embodiments are not limited thereto, and a structure of the integral block 200a may vary.

Figure 4:
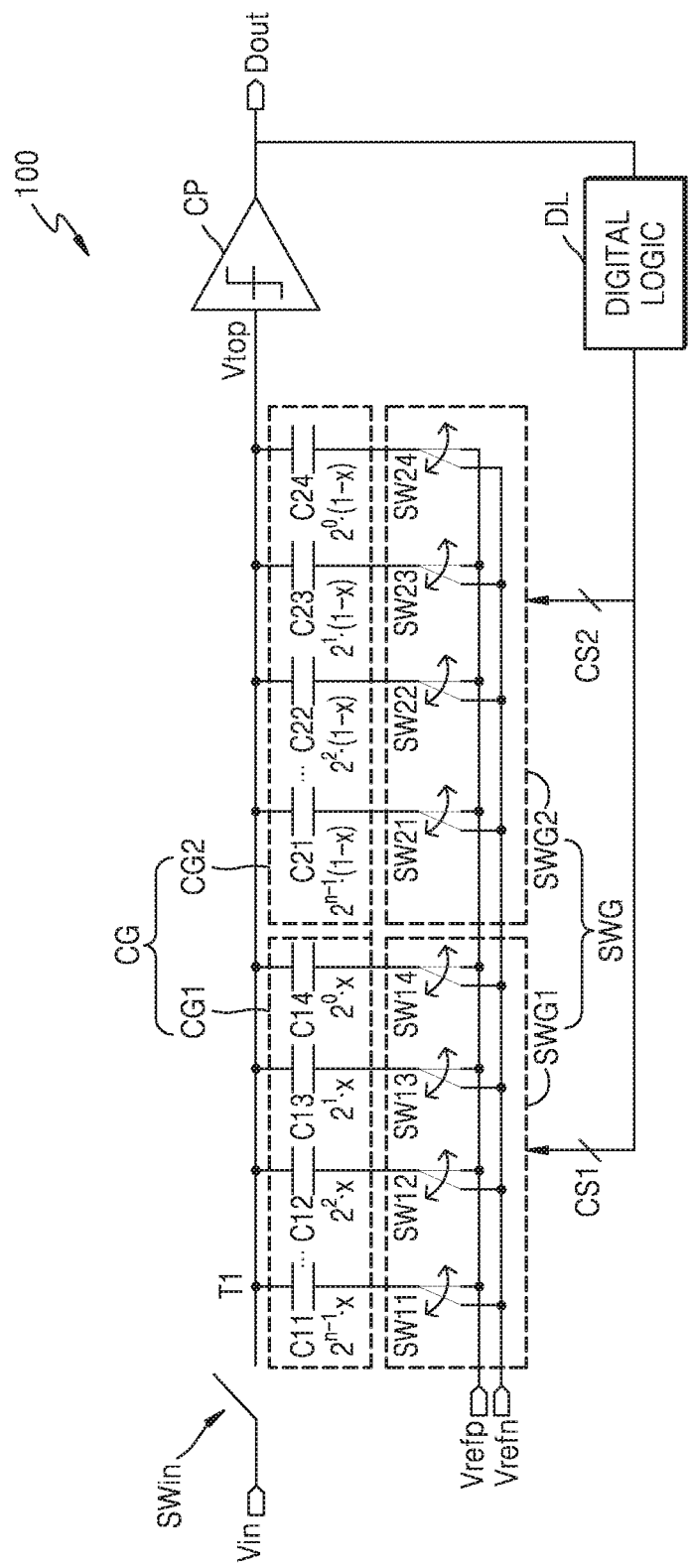
FIG. 4 illustrates a delta modulator according to an example embodiment.
Figure 5:
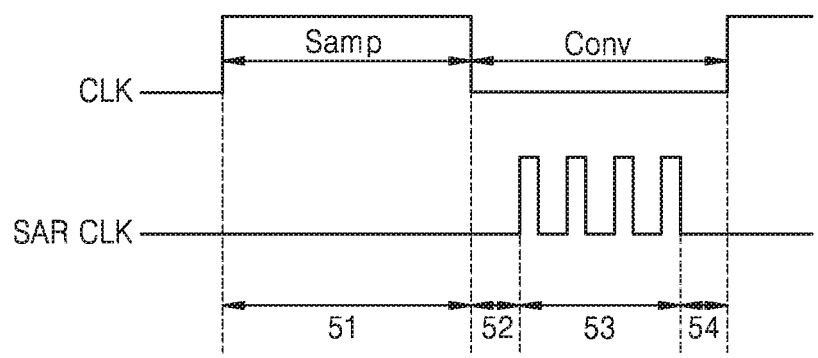
FIG. 5 illustrates a clock signal and a SAR clock signal used in a delta modulator, according to an example embodiment.

FIG. 4 illustrates a delta modulator 100 according to an example embodiment. FIG. 5 illustrates a clock signal CLK and an SAR clock signal SAR CLK used in the delta modulator 100, according to an example embodiment. Hereinafter, descriptions will be provided with reference to FIGS. 4 and 5.

Referring to FIG. 4, the delta modulator 100 may include a capacitor group CG, a comparator CP, and a switch group SWG. Also, the delta modulator 100 may further include a digital logic DL and an input switch SWin. For example, the input switch SWin and the capacitor group CG may form the subtractor 110 of FIG. 2, the comparator CP may form the quantizer 120 of FIG. 2, and the switch group SWG and the digital logic DL may form the amplifier 130 of FIG. 2.

The capacitor group CG may include capacitors C11 to C14 and C21 to C24 that are commonly connected to a first terminal T1. When the digital output signal Dout is an n-bit signal, the number of capacitors C11 to C14 and C21 to C24 may be 2n. In this case, each of the capacitors C11 to C14 and C21 to C24 may include capacitors that are connected to one another in parallel, in series, or in serial-parallel.

The capacitors C11 to C14 and C21 to C24 may be classified into first and second capacitor groups CG1 and CG2 based on variable feedback gains. A ratio of a first capacitance of the first capacitor group CG1 to a second capacitance of the second capacitor group CG2 may be determined based on the variable feedback gains. In an example embodiment, the ratio of the first capacitance to the second capacitance may be x:1−x, wherein x is an arbitrary number (0<x<1) determined based on the variable feedback gain.

The first capacitor group CG1 may include n capacitors, that is, the capacitors C11 to C14. A capacitance of the capacitor C11 may be $2^{n-1}*x$, a capacitance of the capacitor C12 may be $2^2*x$, a capacitance of the capacitor C13 may be $2^1*x$, and a capacitance of the capacitor C14 may be $2^0*x$. The second capacitor group CG2 may include n capacitors, that is, the capacitors C21 to C24. A capacitance of the capacitor C21 may be $2^{n-1}*(1-x)$, a capacitance of the capacitor C22 may be $2^2*(1-x)$, a capacitance of the capacitor C23 may be $2^1*(1-x)$, and a capacitance of the capacitor C24 may be $2^0*(1-x)$, wherein n is the number of bits. For example, when n is 4, the digital output signal Dout may be a 4-bit signal, the capacitances of the capacitors C11 to C14 may be $2^3*x$, $2^2*x$, $2^1*x$, and $2^0*x$, respectively, and the capacitances of the capacitors C21 to C24 may be $2^3*(1-x)$, $2^2*(1-x)$, $2^1*(1-x)$, and $2^0*(1-x)$, respectively.

The input switch SWin may be connected between the first terminal T1 and an input voltage terminal to which the input voltage Vin is applied. The input switch SWin may correspond to a sample-and-hold circuit. In an example embodiment, the input switch SWin may be turned on or off based on the clock signal CLK. In particular, the input switch SWin may be turned on in a sampling phase Samp and off in a conversion phase Conv.

Figure 6A:
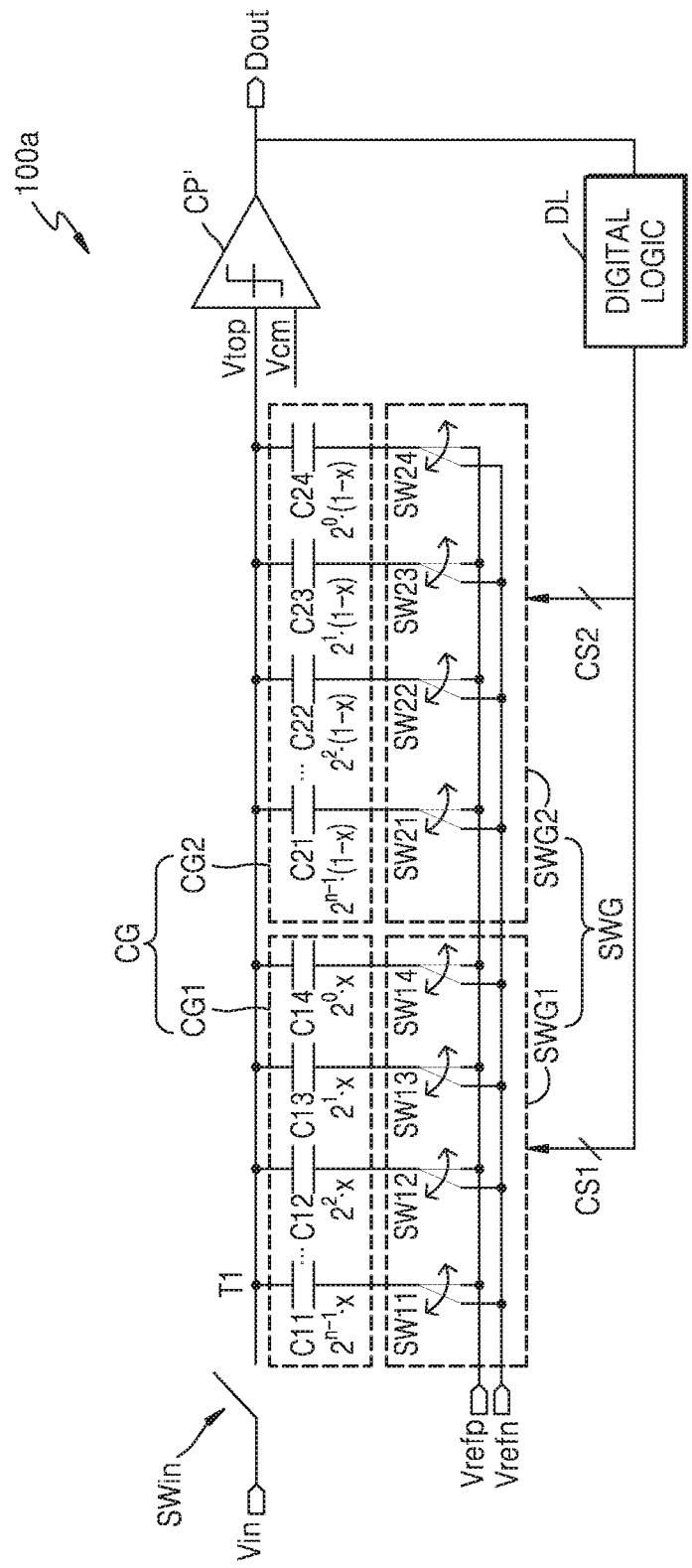
FIG. 6A illustrates a delta modulator according to an example embodiment.
Figure 6B:
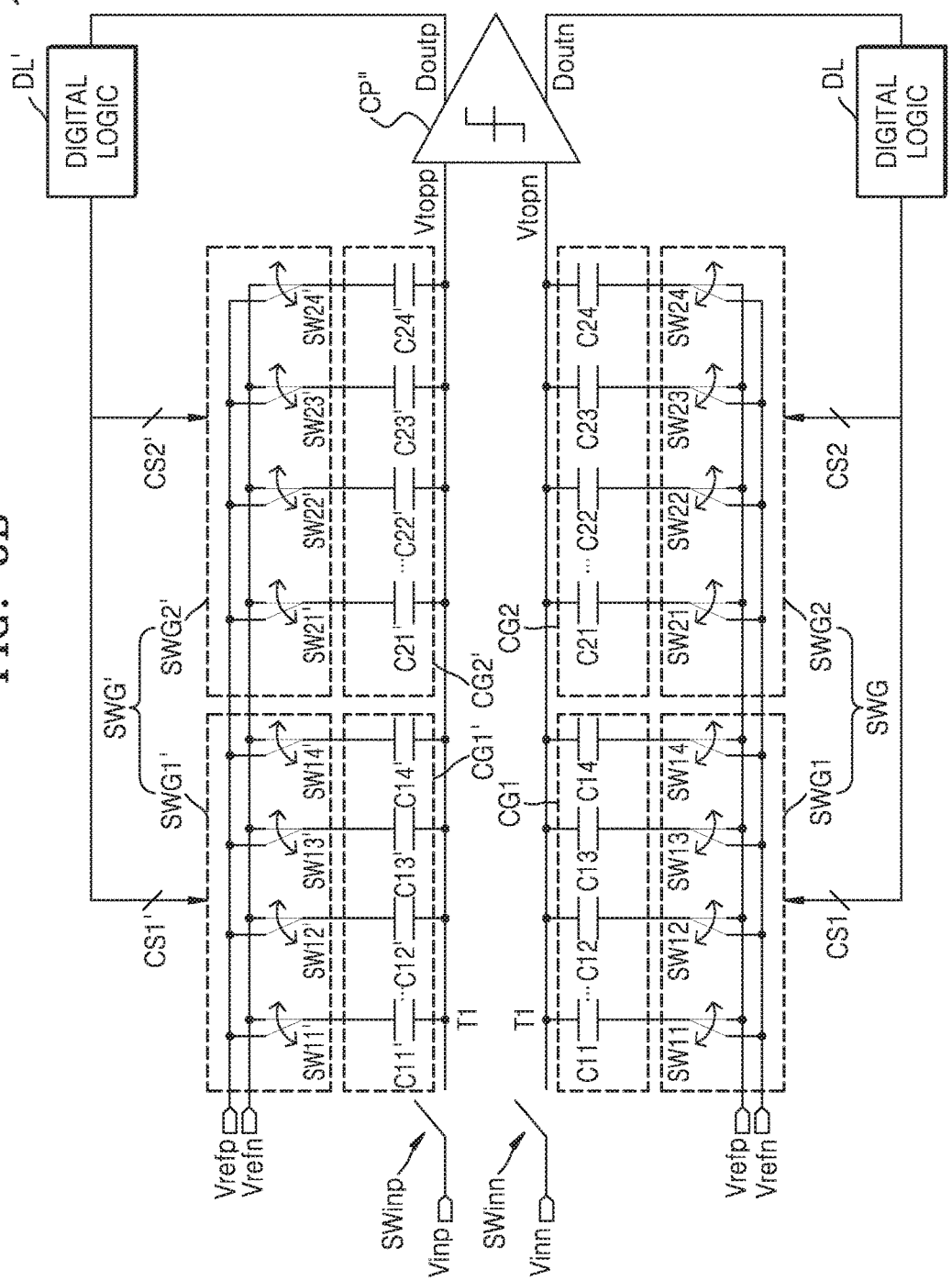
FIG. 6B illustrates a delta modulator according to another example embodiment.

The comparator CP may sequentially generate n-bit digital output signals Dout based on a voltage Vtop of the first terminal T1. In an example embodiment, the comparator CP may be enabled based on the clock signal CLK. In particular, the comparator CP may be off in the sampling phase Samp and on in the conversion phase Conv. In an example embodiment, as illustrated in FIG. 6A, the comparator CP may be embodied in a single-ended manner. In an example embodiment, as illustrated in FIG. 6B, the comparator CP may be embodied in a differential manner. The aforementioned manners will be described with reference to FIGS. 6A and 6B.

The digital logic DL may receive the digital output signal Dout from the comparator CP, generate first and second control signals CS1 and CS2 based on the digital output signal Dout, and respectively provide the generated first and second control signals CS1 and CS2 to first and second switch groups SWG1 and SWG2. In this case, each of the first and second control signals CS1 and CS2 may be embodied as an n-bit signal. For example, the digital logic DL may include a D-flipflop.

In an example embodiment, in the sampling phase Samp, the digital logic DL may generate the first and second control signals CS1 and CS2 based on previous data D[t−1](where t indicates time). In an example embodiment, in the conversion phase Conv, the digital logic DL may generate the first and second control signals CS1 and CS2 based on current data D[t]. For example, in the conversion phase Conv, the digital logic DL may sequentially output the n-bit current data D[t] based on the SAR clock signal SAR CLK.

The switch group SWG may include switches SW11 to SW14 and SW21 to SW24 respectively connected to the capacitors C11 to C14 and C21 to C24. The number of switches SW11 to SW14 and SW21 to SW24 may correspond to the number of capacitors C11 to C14 and C21 to C24 and may be, for example, 2n. The switches SW11 to SW14 and SW21 to SW24 included in the switch group SWG may be classified into the first and second switch groups SWG1 and SWG2. The first switch group SWG1 may be connected to the first capacitor group CG1, and the second switch group SWG2 may be connected to the second capacitor group CG2. Each of the switches may selectively connect a corresponding capacitor to a reference voltage terminal and a ground voltage terminal.

Switches SW11 to SW14 may be connected to either a positive reference voltage terminal Vrefp, to which a positive reference voltage is applied, or a negative reference voltage terminal Vrefn to which a negative reference voltage is applied based on the first control signal CS1. Likewise, switches SW21 to SW24 may be connected to the positive reference voltage terminal Vrefp, to which a positive reference voltage is applied, or the negative reference voltage terminal Vrefn to which a negative reference voltage is applied based on the second control signal CS2. In an example embodiment, the reference voltage REF of FIG. 1 is applied to the positive reference voltage terminal Vrefp, and a ground voltage is applied to the negative reference voltage terminal Vrefn. Hereinafter, the positive reference voltage terminal Vrefp is referred to as a "reference voltage terminal", and the negative reference voltage terminal Vrefn is referred to as a "ground voltage terminal".

Referring to FIG. 5, the clock signal CLK may include the sampling phase Samp and the conversion phase Conv. The clock signal CLK may be an external clock signal transmitted to an ADC (e.g., the ADC of FIG. 2). In an example embodiment, the clock signal CLK may have a high level in the sampling phase Samp and a low level in the conversion phase Conv. However, example embodiments are not limited thereto. The clock signal CLK may have a low level in the sampling phase Samp and a high level in the conversion phase Conv. In an example embodiment, a length of the sampling phase Samp may differ from that of the conversion phase Conv. For example, the length of the conversion phase Conv may be greater than that of the sampling phase Samp, but example embodiments are not limited thereto. In an example embodiment, the length of the sampling phase Samp may be identical to the length of the conversion phase Conv.

The SAR clock signal SAR CLK may be an internal clock signal generated within the ADC based on the clock signal CLK. For example, the SAR clock signal SAR CLK may be generated by the comparator CP. However, example embodiments are not limited thereto. In an example embodiment, the SAR clock signal SAR CLK may include n cycles in the conversion phase Conv. For example, n may be 4. One clock cycle including the sampling phase Samp and the conversion phase Conv may be divided into first to fourth phases 51 to 54. In particular, the sampling phase Samp may correspond to the first phase 51, and the conversion phase Conv may correspond to the second to fourth phases 52 to 54. Hereinafter, an operation of the delta modulator 100 in the first to fourth phases 51 to 54 will be described.

In the first phase 51, the input switch SWin is turned on, and the switches SW11 to SW14 and SW21 to SW24 of the switch group SWG are turned on/off based on the previous data D[t−1]. Accordingly, the voltage Vtop of the first terminal T1 corresponds to the input voltage Vin. In the second phase 52, the input switch SWin is turned off, and the switches SW11 to SW14 and SW21 to SW24 of the switch group SWG are turned on/off based on the previous data D[t−1] as in the first phase 51. Accordingly, the voltage Vtop of the first terminal T1 corresponds to a difference between the input voltage Vin and a voltage based on the previous data D[t−1].

In the third phase 53, in the entire phase of the SAR clock signal SAR CLK, the switches SW11 to SW14 and SW21 to SW24 may be sequentially turned on or off based on respective bits of the current data D[t], and levels of reference voltages that may be applied to the switches SW11 to SW14 and SW21 to SW24 may be determined based on feedback gains. Accordingly, the voltage Vtop of the first terminal T1 sequentially changes based on the current data D[t]. In the fourth phase 54, on/off states of the switches SW11 to SW14 and SW21 to SW24 of the switch group SWG do not change, and accordingly, the voltage Vtop of the first terminal T1 corresponds a sum of a voltage according to the current data D[t] and the difference between the input voltage Vin and the voltage according to the previous data D[t−1].

Generally, a delta modulator includes passive elements and has a feedback gain that is fixed to 1. To adjust the feedback gain of the delta modulator, the delta modulator includes at least two voltage generators for respectively providing the first reference voltage used in the sampling phase and the second reference voltage used in the conversion phase. However, because power consumption and implementation areas of the reference voltage generators are greater than those of the delta modulator, when the delta modulator includes multiple reference voltage generators, the power consumption and the implementation area of the delta modulator may greatly increase.

However, according to the present example embodiment, the capacitor group CG is classified into the first and second capacitor groups CG1 and CG2, and a ratio of capacitances of the first and second capacitor groups CG1 and CG2 is determined based on the feedback gains so that the sampling operation and the conversion operation may be performed by selectively controlling the first and second capacitor groups CG1 and CG2 based on the feedback gains. Therefore, although a uniform reference voltage is applied in the sampling phase and the conversion phase, the feedback gain may be less or greater than 1. Therefore, according to the present example embodiment, the delta modulator 100 having the variable feedback gain may be embodied to have lower power consumption and small implementation area.

FIG. 6A illustrates an example of the delta modulator 100 according to an example embodiment.

Referring to FIG. 6A, a delta modulator 100a may be embodied in a single-ended manner. The delta modulator 100a may be embodied in a substantially similar manner to the delta modulator 100 of FIG. 4, and thus, only differences between the delta modulator 100a and the delta modulator 100 will be described. A comparator CP' may receive the voltage Vtop of the first terminal T1 from a first input terminal and may receive a common voltage Vcm from a second input terminal. The comparator CP' may generate a digital output signal Dout by comparing the voltage Vtop of the first terminal T1 with the common voltage Vcm. For example, the common voltage Vcm may be expressed via Equation 1.

$$Vcm = (1\ 0\ \ldots\ 0\ 0) \cdot \begin{pmatrix} 2^{n-1} \\ 2^{n-2} \\ \ldots \\ 2^1 \\ 2^0 \end{pmatrix}$$ [Equation 1]

FIG. 6B illustrates another example of the delta modulator 100 according to an example embodiment.

Referring to FIG. 6B, a delta modulator 100b may be embodied in a differential manner. Unlike the delta modulator 100 of FIG. 4, the delta modulator 100b may receive a positive input voltage Vinp and a negative input voltage Vinn and may generate a positive digital output signal Doutp and a negative digital output signal Doutn. In particular, the delta modulator 100b may include a pair of capacitor groups CG and CG', a pair of switch groups SWG and SWG', a pair of digital logics DL and DL', a pair of input switches SWinp and SWinn, and a comparator CP''.

The capacitor group CG may include the first and second capacitor groups CG1 and CG2, and the capacitor group CG' may include first and second capacitor groups CG1' and CG2'. The capacitor groups CG and CG' may be embodied in substantially the same manner as each other. The switch group SWG may include the switches SW11 to SW14 and SW21 to SW24, and the switch group SWG' may include switches SW11' to SW14' and SW21' to SW24'. The switch groups SWG and SWG' may be embodied in substantially the same manner as each other.

The input switch SWinn may apply the negative input voltage Vinn to the first terminal T1, and the input switch SWinp may apply the positive input voltage Vinp to a second terminal T2. The comparator CP'' may compare a voltage Vtopn of the first terminal T1 with a voltage Vtopp of the second terminal T2 and thus may generate the negative digital output signal Doutn and the positive digital output signal Doutp. The digital logic DL may generate first and second control signals CS1 and CS2 based on the negative digital output signal Doutn, and the digital logic DL' may generate first and second control signals CS1' and CS2' based on the positive digital output signal Doutp.

Figure 7A:
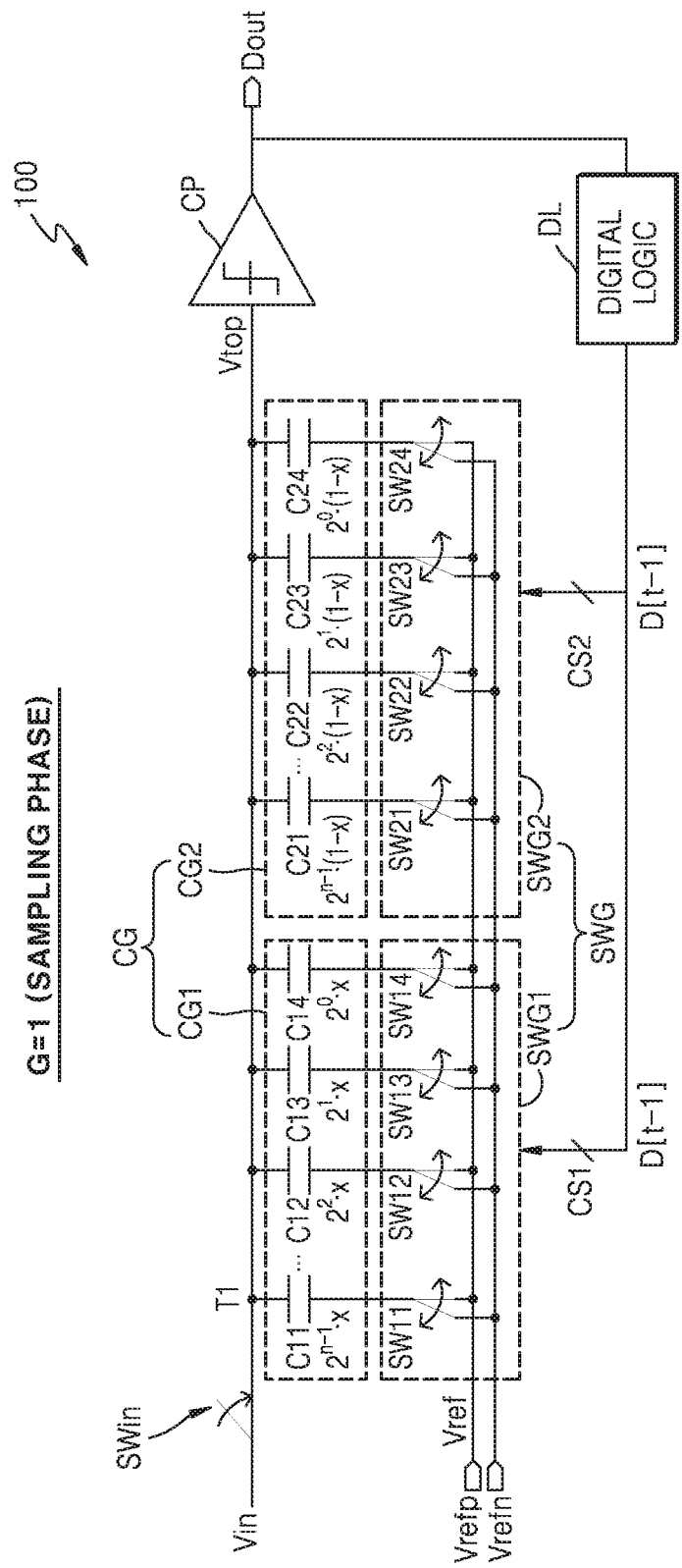
FIGS. 7A and 7B respectively illustrate a sampling operation and a conversion operation when a feedback gain of a delta modulator is 1, according to an example embodiment.
Figure 7B:
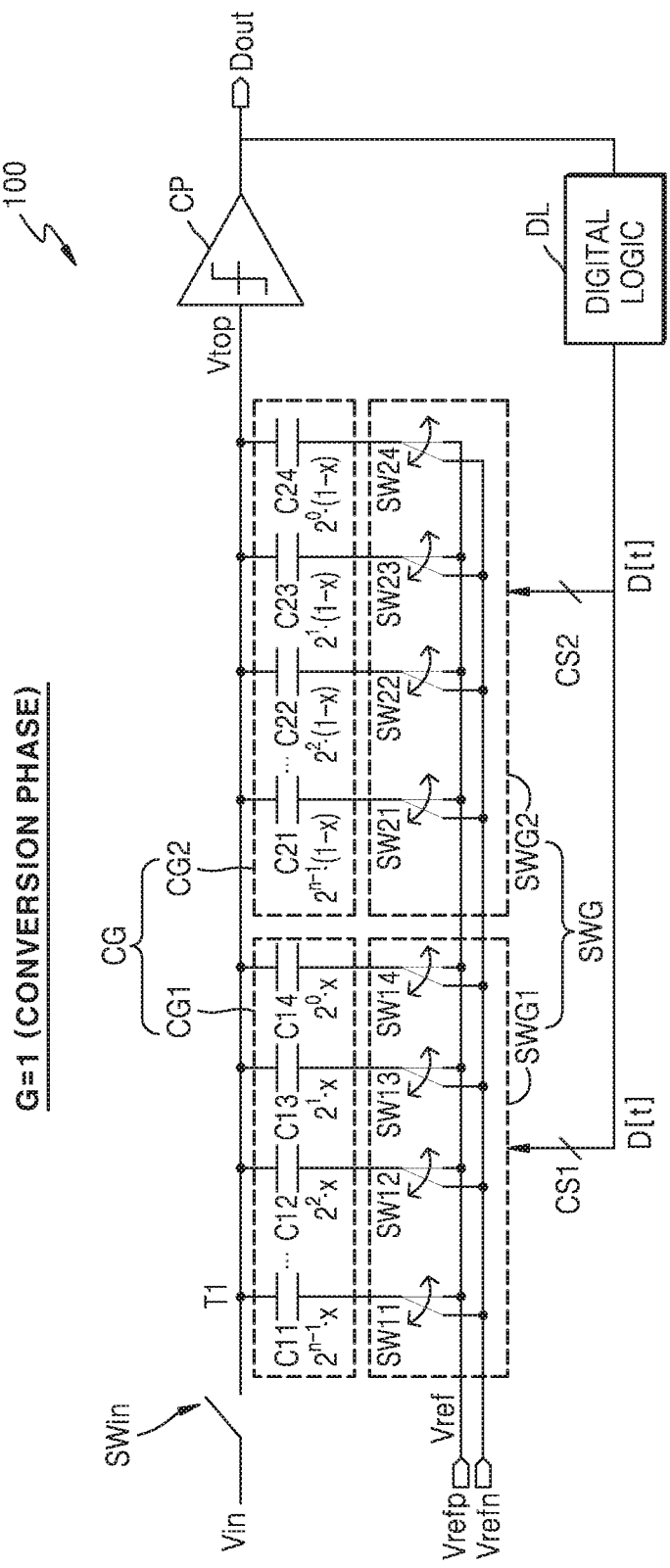

FIGS. 7A and 7B respectively illustrate a sampling operation and a conversion operation when a feedback gain G of the delta modulator 100 of FIG. 4 is 1, according to an example embodiment. Hereinafter, the sampling operation and the conversion operation will be described with reference to FIGS. 4, 5, 7A, and 7B.

Referring to FIG. 7A, when the feedback gain G is 1, a reference voltage Vref applied to a reference voltage terminal Vrefp may have a first voltage level, and x may be an arbitrary real number between 0 and 1 (0<x<1). In this case, a result obtained when the feedback gain G is 1 may be the same as a result obtained when the capacitor group G is not classified into the first and second capacitor groups CG1 and CG2.

In the sampling phase Samp, the input switch SWin may be turned on in response to the clock signal CLK, and accordingly, the input voltage Vin may be applied to the first terminal T1. Also, in the sampling phase Samp, the digital logic DL may provide the first and second control signals CS1 and CS2 to the first and second switch groups SWG1 and SWG2, respectively. In this case, the first and second control signals CS1 and CS2 may be n-bit signals and may be identical to each other. In particular, the first and second control signals CS1 and CS2 may be identical to each other as n-bit previous data D[t−1]. The switches SW11 to SW14 of the first switch group SWG1 may be connected to the reference voltage terminal Vrefp or a ground voltage terminal Vrefn based on the first control signal CS1. Likewise, the switches SW21 to SW24 of the second switch group SWG2 may be connected to the reference voltage terminal Vrefp or the ground voltage terminal Vrefn based on the second control signal CS2.

In the first phase 51, corresponding to the sampling phase Samp, the voltage Vtop of the first terminal T1 may correspond to the input voltage Vin, and in the second phase 52 after the sampling phase Samp ends, the voltage Vtop of the first terminal T1 may be expressed via Equation 2.

$$Vtop=Vin-Dout[t-1]\cdot Vref/2^n \quad \text{[Equation 2]}$$

In Equation 2, Dout[t−1] corresponds to previous data, Vref indicates a reference voltage applied to the reference voltage terminal Vrefp, and n indicates the number of bits.

Referring to FIG. 7B, in the conversion phase Conv, the input switch SWin may be turned off in response to the clock signal CLK, and accordingly, the input voltage Vin may not be applied to the first terminal T1. In addition, in the conversion phase Conv, the digital logic DL may provide the first and second control signals CS1 and CS2 to the first and second switch groups SWG1 and SWG2, respectively. In this case, the first and second control signals CS1 and CS2 may be n-bit signals that are sequentially provided and may be identical to each other. In particular, the first and second control signals CS1 and CS2 may be identical to each other as n-bit current data D[t].

In the third phase 53, corresponding to the conversion phase Conv, the digital logic DL may sequentially output each bit of the current data D[t] as the first and second control signals CS1 and CS2, based on the SAR clock signal SAR CLK. The switches SW11 to SW14 of the first switch group SWG1 may be sequentially connected to the reference voltage terminal Vrefp or the ground voltage terminal Vrefn based on the first control signal CS1. Likewise, the switches SW21 to SW24 of the second switch group SWG2 may be sequentially connected to the reference voltage terminal Vrefp or the ground voltage terminal Vrefn based on the second control signal CS2. In the fourth phase 54, the voltage Vtop of the first terminal T1 may be expressed via Equation 3.

$$Vtop=Vin-Dout[t-1]\cdot Vref/2^n+Dout[t]\cdot Vref/2^n \quad \text{[Equation 3]}$$

In Equation 3, Dout[t] corresponds to current data, Vref indicates a reference voltage applied to the reference voltage terminal Vrefp, and n indicates the number of bits. Dout[t] may be expressed via Equation 4.

$$Dout[t] = \quad \text{[Equation 4]}$$
$$(Data[t][n-1]\ Data[t][n-2]\ \ldots\ Data[t][1]\ Data[t][0]) \cdot \begin{pmatrix} 2^{n-1} \\ 2^{n-2} \\ \ldots \\ 2^1 \\ 2^0 \end{pmatrix}$$

In Equation 4, Data[t][n−1] corresponds to the most significant bit (MSB) of Dout[t], and Data[t][0] corresponds to the least significant bit (LSB) of Dout[t].

Figure 8A:
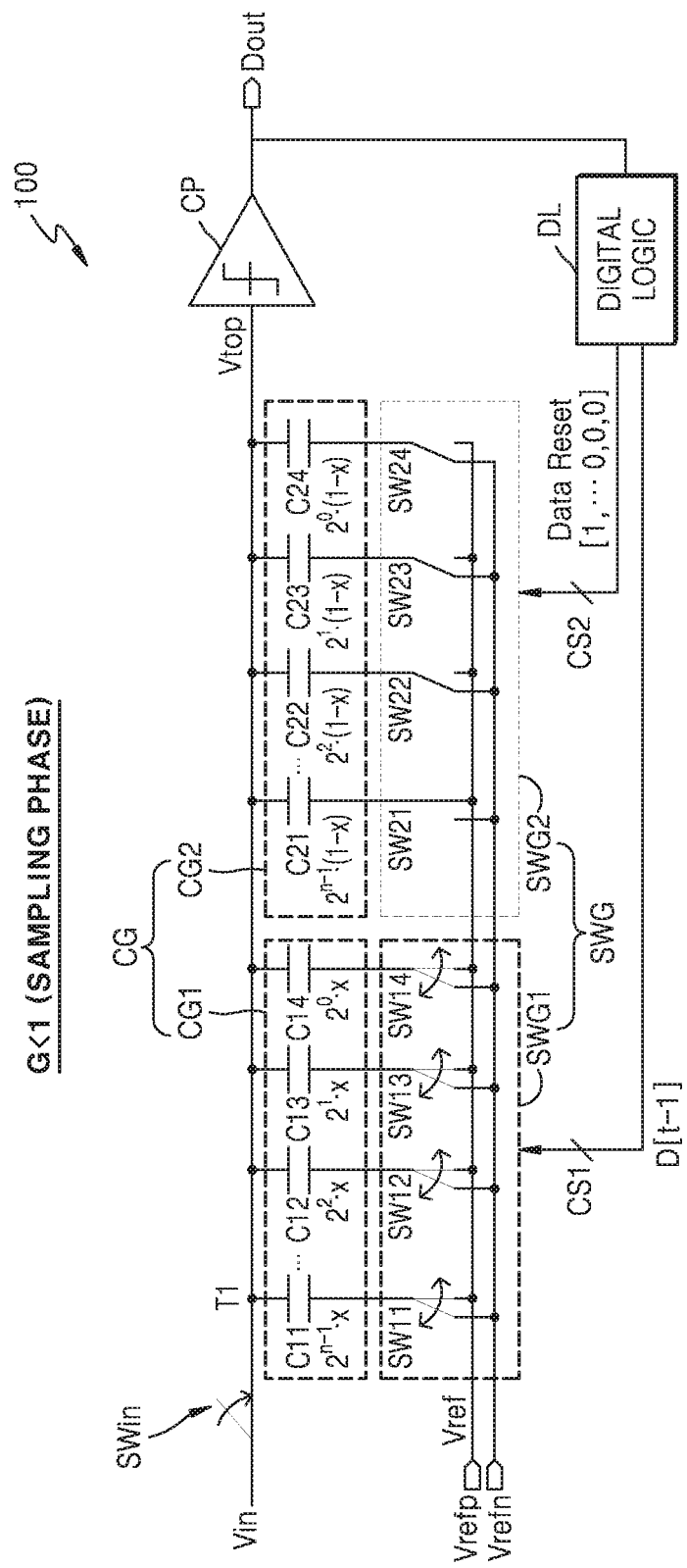
FIGS. 8A and 8B respectively illustrate a sampling operation and a conversion operation when a feedback gain of a delta modulator is less than 1, according to an example embodiment.
Figure 8B:
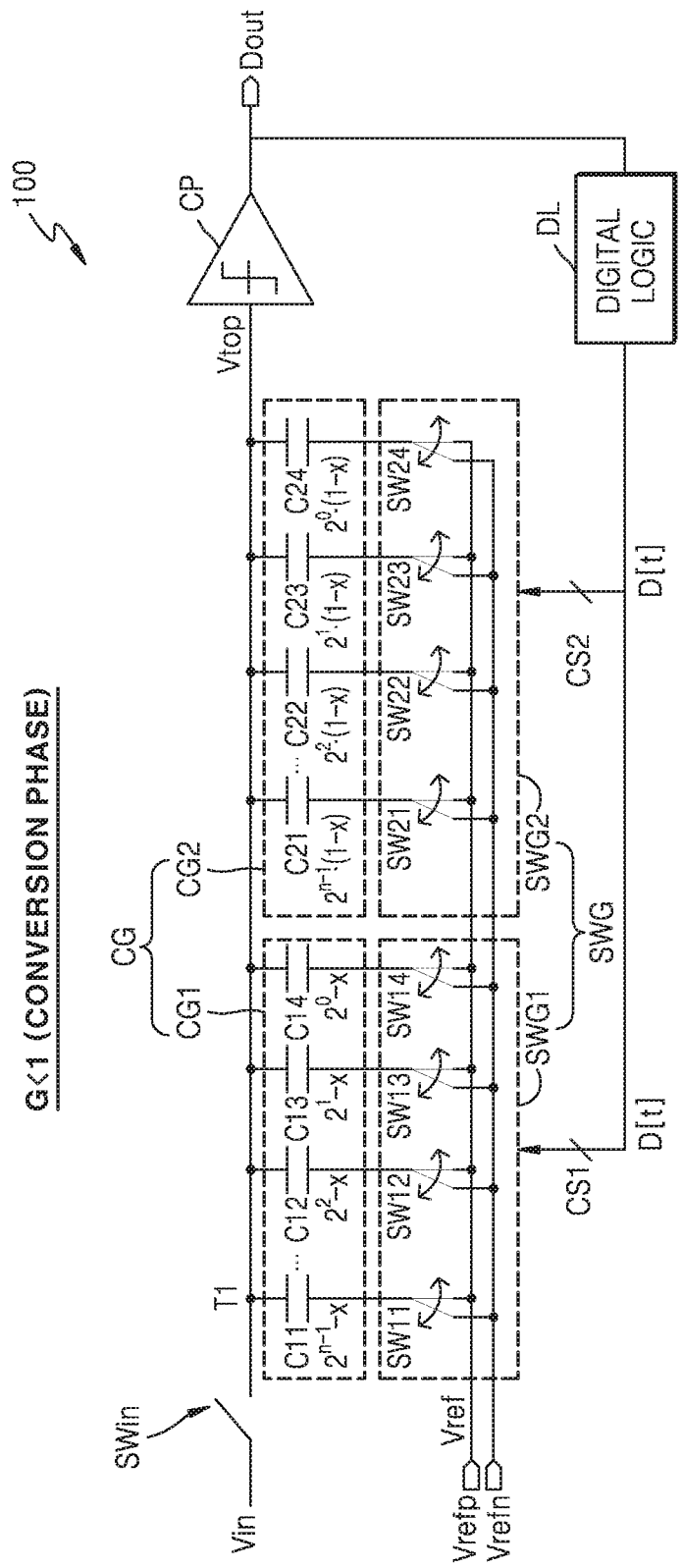

FIGS. 8A and 8B respectively illustrate a sampling operation and a conversion operation when a feedback gain G of the delta modulator 100 of FIG. 4 is less than 1, according to an example embodiment. Hereinafter, the sampling operation and the conversion operation will be described with reference to FIGS. 4, 5, 8A, and 8B.

Referring to FIG. 8A, when the feedback gain G is less than 1, a level of the reference voltage Vref applied to the reference voltage terminal Vrefp may be the first voltage level, and x has a value equivalent to the feedback gain G and may be an arbitrary real number between 0 and 1 (i.e., x=G, 0<x<1).

In the sampling phase Samp, the input switch SWin may be turned on in response to the clock signal CLK, and accordingly, the input voltage Vin may be applied to the first terminal T1. In addition, in the sampling phase Samp, the digital logic DL may provide the first control signal CS1 to the first switch group SWG1, and the first control signal CS1 may be n-bit previous data D[t−1]. The switches SW11 to SW14 of the first switch group SWG1 may be connected to the reference voltage terminal Vrefp or the ground voltage terminal Vrefn, in response to the first control signal CS1. The reference voltage Vref may be applied to the reference voltage terminal Vrefp, and a ground voltage may be applied to the ground voltage terminal Vrefn.

In the sampling phase Samp, the digital logic DL may provide the second control signal CS2 to the second switch group SWG2, and the second control signal CS2 may be n-bit reset data. For example, the reset data may be [1, . . . , 0, 0, 0]. In this case, the switch SW21 may be connected to the reference voltage terminal Vrefp, and the switches SW22 to SW24 may be connected to the ground voltage terminal Vrefn. Thus, it may be considered that the common voltage Vcm is applied to the second capacitor group CG2. However, the second control signal CS2 is not limited to [1, . . . , 0, 0, 0], and the switches SW21 to SW24 of the second switch group SWG2 may be configured to generate arbitrary reset data regardless of the previous data D[t−1].

In the first phase 51, corresponding to the sampling phase Samp, the voltage Vtop of the first terminal T1 may correspond to the input voltage Vin, and in the second phase 52 after the sampling phase Samp ends, the voltage Vtop of the first terminal T1 may be expressed via Equation 5.

$$Vtop = Vin - x \cdot Dout[t-1] \cdot Vref/2^n \qquad \text{[Equation 5]}$$

In Equation 5, Dout[t−1] corresponds to previous data, Vref indicates a reference voltage applied to the reference voltage terminal Vrefp, and n indicates the number of bits. In the present example embodiment, unlike Equation 2, Equation 5 shows that a voltage, which corresponds to Dout[t−1]·Vref/2$^n$ multiplied by x, is deducted from the input voltage Vin as the second control signal CS2 is set as reset data. Thus, in comparison with a case where the feedback gain is 1, a deducted voltage amount may decrease.

Referring to FIG. 8B, in the conversion phase Conv, the input switch SWin is turned off in response to the clock signal CLK, and accordingly, the input voltage Vin may not be applied to the first terminal T1. Also, in the conversion phase Conv, the digital logic DL may provide the first and second control signals CS1 and CS2 to the first and second switch groups SWG1 and SWG2, respectively. In this case, the first and second control signals CS1 and CS2 may be n-bit signals that are sequentially provided and may be identical to each other. In particular, the first and second control signals CS1 and CS2 may be identical to each other as n-bit current data D[t].

In the third phase 53, corresponding to the conversion phase Conv, the digital logic DL may sequentially output each bit of the current data D[t] as the first and second control signals CS1 and CS2, based on the SAR clock signal SAR CLK. The switches SW11 to SW14 of the first switch group SWG1 may be sequentially connected to the reference voltage terminal Vrefp or the ground voltage terminal Vrefn, in response to the first control signal CS1. Likewise, the switches SW21 to SW24 of the second switch group SWG2 may be sequentially connected to the reference voltage terminal Vrefp or the ground voltage terminal Vrefn, in response to the second control signal CS2. In the fourth phase 54, the voltage Vtop of the first terminal T1 may be expressed via Equation 6.

$$Vtop = Vin - x \cdot Dout[t-1] \cdot Vref/2^n + Dout[t] \cdot Vref/2^n \qquad \text{[Equation 6]}$$

In Equation 6, Dout[t] corresponds to current data, Vref indicates a reference voltage applied to the reference voltage terminal Vrefp, and n indicates the number of bits. In the present example embodiment, although the feedback gain G is less than 1, the conversion operation is performed by setting the first and second control signals CS1 and CS2 as the n-bit current data D[t], in the conversion phase. Thus, the feedback gain less than 1 does not affect the conversion operation.

Figure 9A:
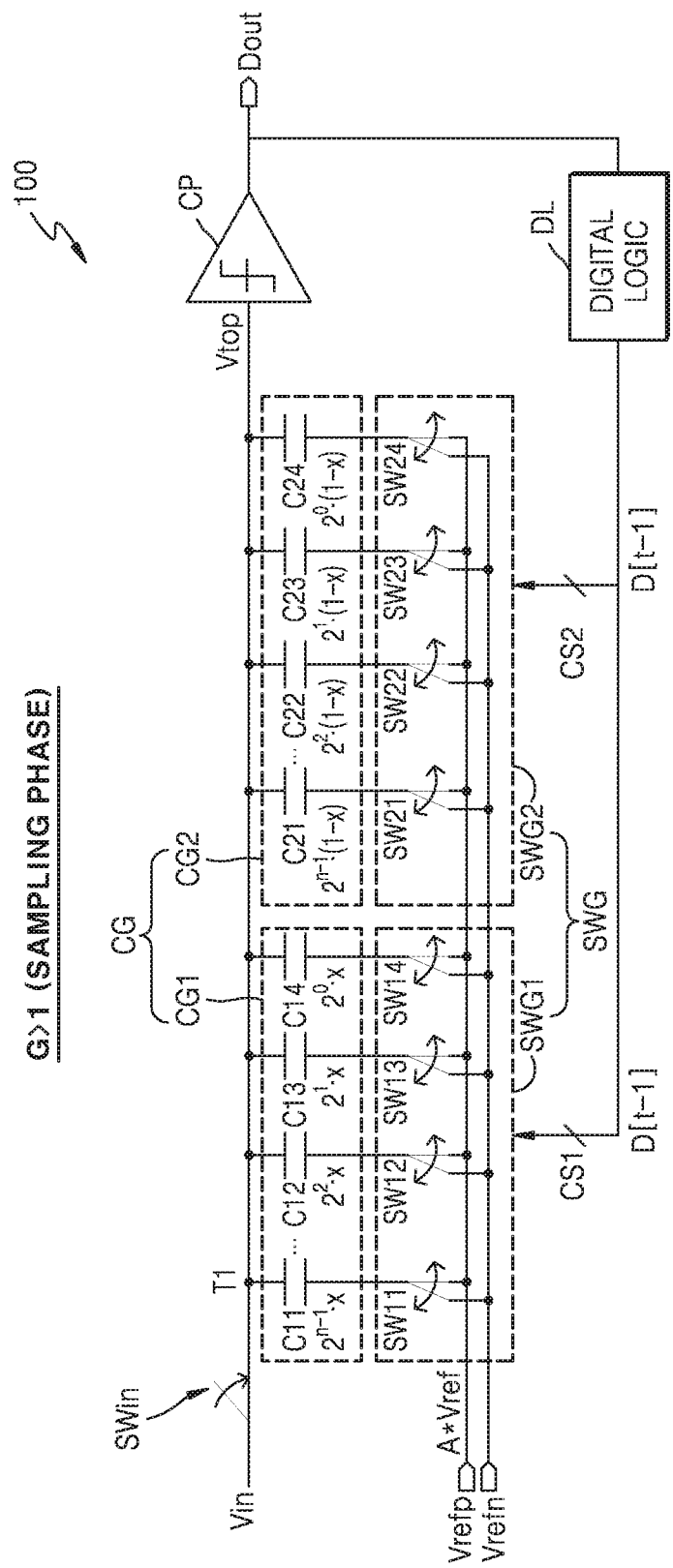
FIGS. 9A and 9B respectively illustrate a sampling operation and a conversion operation when a feedback gain of a delta modulator is greater than 1, according to an example embodiment.
Figure 9B:
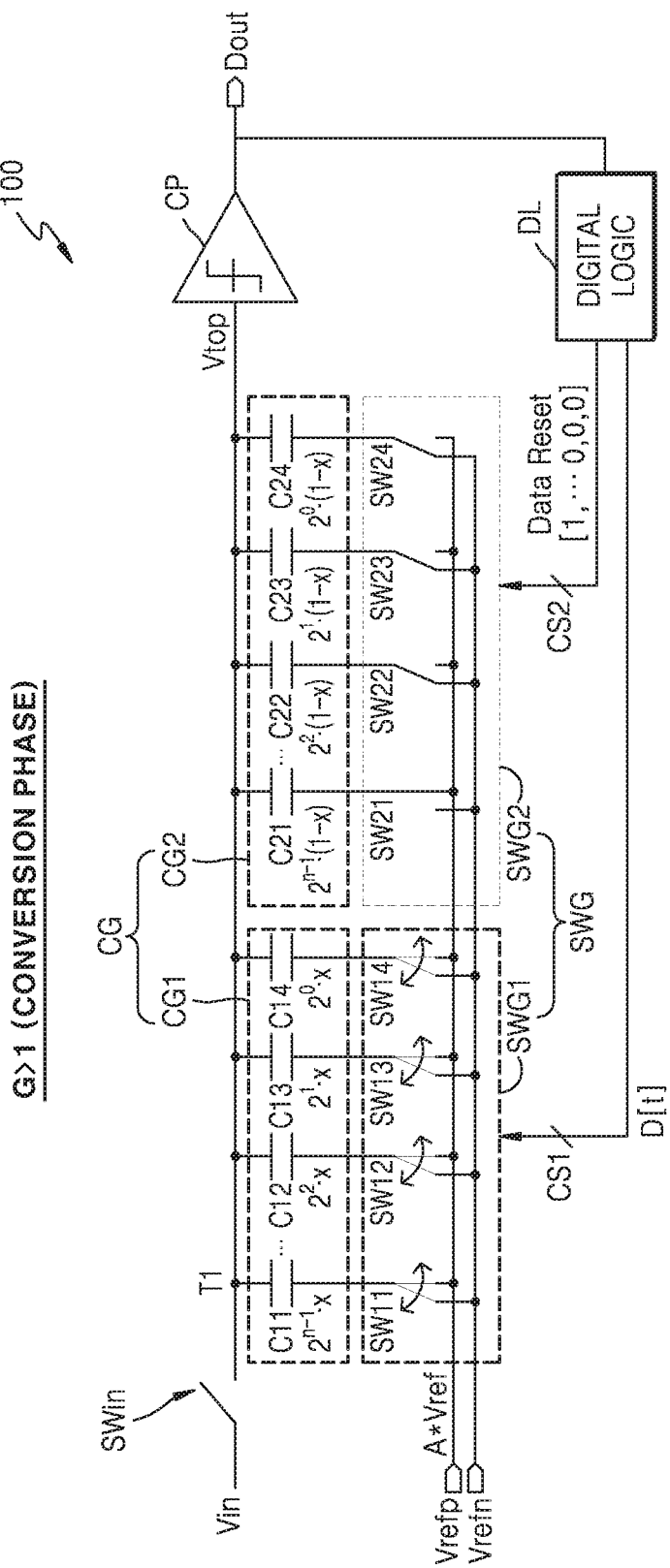

FIGS. 9A and 9B respectively illustrate the sampling operation and the conversion operation when the feedback gain G of the delta modulator 100 of FIG. 4 is greater than 1, according to an example embodiment. Hereinafter, the sampling operation and the conversion operation will be described with reference to FIGS. 4, 5, 9A, and 9B.

Referring to FIG. 9A, when the feedback gain G is greater than 1, a level of a reference voltage A·Vref applied to the reference voltage terminal Vrefp may be a second voltage level, and the second voltage level may correspond to an integer multiple of the first voltage level of FIGS. 7A and 7B. In this case, A may have a value corresponding to the feedback gain G (that is, A=G). In addition, x multiplied by the feedback gain G is equal to 1, and x may be an arbitrary real number between 0 and 1 (that is, x·G=1, 0<x<1).

In the sampling phase Samp, the input switch SWin may be turned on in response to the clock signal CLK, and accordingly, the input voltage Vin may be applied to the first terminal T1. In addition, in the sampling phase Samp, the digital logic DL may provide the first and second control signals CS1 and CS2 to the first and second switch groups SWG1 and SWG2. In this case, the first and second control signals CS1 and CS2 may be n-bit signals and may be identical to each other. In particular, the first and second control signals CS1 and CS2 may be identical to each other as the n-bit previous data D[t−1]. The switches SW11 to SW14 of the first switch group SWG1 may be connected to the reference voltage terminal Vrefp or the ground voltage terminal Vrefn based on the first control signal CS1. Likewise, the switches SW21 to SW24 of the second switch group SWG2 may be connected to the reference voltage terminal Vrefp or the ground voltage terminal Vrefn based on the second control signal CS2.

In the first phase 51, corresponding to the sampling phase Samp, the voltage Vtop of the first terminal T1 corresponds to the input voltage Vin, and in the second phase 52 after the sampling phase Samp ends, the voltage Vtop of the first terminal T1 may be expressed via Equation 7.

$$Vtop = Vin - A \cdot Dout[t-1] \cdot Vref/2^n \qquad \text{[Equation 7]}$$

In Equation 7, Dout[t−1] corresponds to previous data, A·Vref indicates a reference voltage applied to the reference voltage terminal Vrefp, and n indicates the number of bits. In the present example embodiment, because the feedback gain G is greater than 1, a level of the reference voltage A·Vref that is applied to the reference voltage terminal Vrefp is higher than that of the reference voltage Vref of FIGS. 7A and 8A. Accordingly, unlike in Equation 2, Equation 7 shows that a voltage, which corresponds to Dout[t−1]·Vref/2$^n$ multiplied by A, is deducted from the input voltage Vin. Thus, in comparison with the case where the feedback gain G is 1, a deducted voltage amount may increase.

Referring to FIG. 9B, in the conversion phase Conv, the input switch SWin may be turned off in response to the clock signal CLK, and accordingly, the input voltage Vin may not be applied to the first terminal T1. In addition, in the conversion phase Conv, the digital logic DL may provide the first control signal CS1 to the first switch group SWG1. The first control signal CS1 may be n-bit current data D[t] that is sequentially output.

In the sampling phase Samp, the digital logic DL may provide the second control signal CS2 to the second switch group SWG2, and the second control signal CS2 may be n-bit reset data. For example, the reset data may be [1, . . . , 0, 0, 0]. In this case, the switch SW21 may be connected to the reference voltage terminal Vrefp, and the switches SW22 to SW24 may be connected to the ground voltage terminal Vrefn. Thus, it may be considered that the common voltage Vcm is applied to the second capacitor group CG2. However, the second control signal CS2 is not limited to [1, . . . , 0, 0, 0], and the switches SW21 to SW24 of the second switch group SWG2 may generate arbitrary reset data that may be fixed regardless of the previous data D[t−1].

In the third phase 53, corresponding to the conversion phase Conv, the digital logic DL may sequentially output each bit of the current data D[t] as the first control signal CS1, based on the SAR clock signal SAR CLK. The switches SW11 to SW14 of the first switch group SWG1 may be sequentially connected to the reference voltage terminal Vrefp or the ground voltage terminal Vrefn, in response to the first control signal CS1. In the fourth phase 54, the voltage Vtop of the first terminal T1 may be expressed via Equation 8.

$$Vtop=Vin-A \cdot Dout[t-1] \cdot Vref/2^n+A \cdot x \cdot Dout[t] \cdot Vref/2^n \quad \text{[Equation 8]}$$

In Equation 8, Dout[t] corresponds to current data, A·Vref indicates a reference voltage applied to the reference voltage terminal Vrefp, and n indicates the number of bits. In the present example embodiment, when the feedback gain G is greater than 1, and accordingly, although a high reference voltage A·Vref is applied to the reference voltage terminal Vrefp, the conversion operation may be performed by setting the first control signal CS1 as the n-bit current data D[t] and the second control signal CS2 as the n-bit reset data in the conversion phase. In this case, because A·x is 1, the feedback gain G greater than 1 does not affect the conversion operation.

Figure 10:
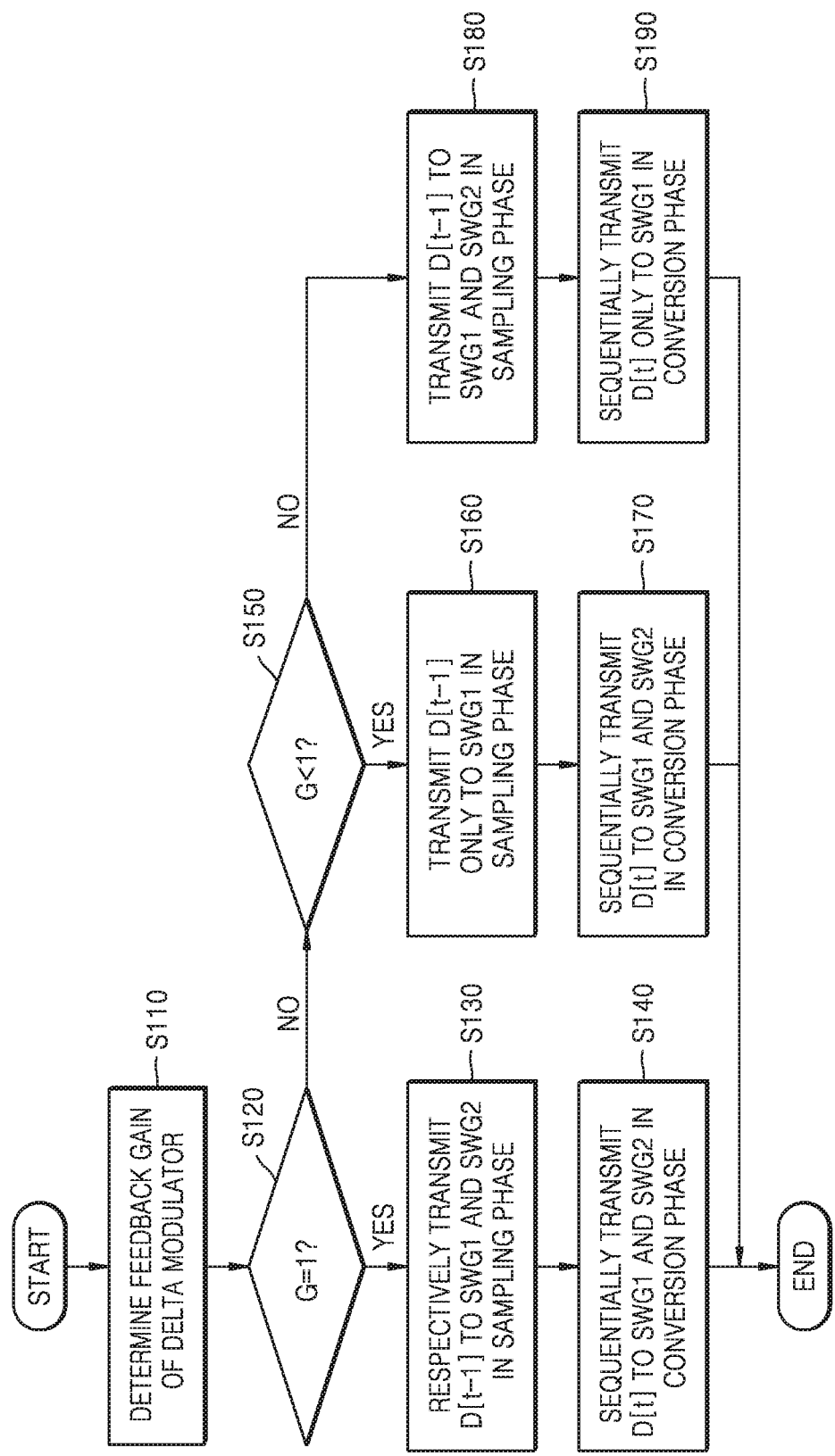
FIG. 10 is a flowchart of a delta modulation method according to an example embodiment.

FIG. 10 is a flowchart of a delta modulation method according to an example embodiment.

Referring to FIG. 10, the delta modulation method according to the present example embodiment is a method of performing the sampling operation and the conversion operation by controlling at least one of the first and second capacitor groups CG1 and CG2 respectively in the sampling phase and the conversion phase, based on a variable feedback gain. The descriptions provided with reference to FIGS. 1 to 9B may be applied to the present example embodiment, and repeated descriptions will be omitted. The delta modulation method according to the present example embodiment may include, for example, serially timed operations performed by the delta modulator 100 of FIG. 4. Hereinafter, the delta modulation method will be described with reference to FIGS. 4 and 10.

In operation S110, the feedback gain G of a delta modulator is determined. For example, when a clock signal has a high frequency, the feedback gain G may decrease, and when the clock signal has a low frequency, the feedback gain G may increase. In operation S120, a determination as to whether the feedback gain G is 1 is made. According to a determination result, when the feedback gain G is 1, operation S130 is performed, but if not, operation S150 is performed. In operation S150, a determination as to whether the feedback gain G is less than 1 is made. According to a determination result, when the feedback gain G is less than 1, operation S160 is performed, but if not, operation S180 is performed.

In operation S130, in the sampling phase, the previous data D[t−1] may be respectively transmitted to the first and second switch groups SWG1 and SWG2. For example, the digital logic DL may respectively generate n-bit first and second control signals CS1 and CS2 based on the previous data D[t−1], and may respectively transmit the n-bit first and second control signals CS1 and CS2 to the first and second switch groups SWG1 and SWG2. In this case, the switches SW11 to SW14 and SW21 to SW24 included in the first and second switch groups SWG1 and SWG2 may provide the reference voltage Vref having the first voltage level or the ground voltage to the capacitors C11 to C14 and C21 to C24, based on the previous data D[t−1].

In operation S140, in the conversion phase, the current data D[t] may be sequentially provided to the first and second switch groups SWG1 and SWG2. For example, the digital logic DL may generate the n-bit first and second control signals CS1 and CS2 based on the current data D[t] and may sequentially provide the generated n-bit first and second control signals CS1 and CS2 to the first and second switch groups SWG1 and SWG2.

In operation S160, in the sampling phase, the previous data D[t−1] is provided only to the first switch group SWG1. For example, the digital logic DL may generate the n-bit first control signal CS1 based on the previous data D[t−1] and provide the generated n-bit first control signal CS1 to the first switch group SWG1. In this case, the digital logic DL may provide the second switch group SWG2 with reset data that is not related to the previous data D[t−1]. In this case, the switches SW11 to SW14 of the first switch group SWG1 may respectively provide the capacitors C11 to C14 and C21 to C24 with the reference voltage Vref having the first voltage level or ground voltage, based on the previous data D[t−1].

In operation S170, in the conversion phase, the current data D[t] is provided sequentially to the first and second switch groups SWG1 and SWG2. For example, the digital logic DL may respectively generate the n-bit first and second control signals CS1 and CS2 based on the current data D[t] and may sequentially provide the generated n-bit first and second control signals CS1 and CS2 to the first and second switch groups SWG1 and SWG2, respectively.

In operation S180, in the sampling phase, the previous data D[t−1] may be provided to each of the first and second switch groups SWG1 and SWG2. For example, the digital logic DL may generate the n-bit first and second control signals CS1 and CS2 based on the previous data D[t−1] and may respectively provide the generated n-bit first and second control signals CS1 and CS2 to the first and second switch groups SWG1 and SWG2. In this case, the switches SW11 to SW14 and SW21 to SW24 included in the first and second switch groups SWG1 and SWG2 may provide the reference voltage A·Vref having the second voltage level or ground voltage to the capacitors C11 to C14 and C21 to C24.

In operation S190, in the conversion phase, the current data D[t] is sequentially provided only to the first switch group SWG1. For example, the digital logic DL may generate the n-bit first control signal CS1 based on the current data D[t] and may sequentially provide the generated n-bit first control signal CS1 to the first switch group SWG1. In this case, the digital logic DL may provide the second switch group SWG2 with reset data that is not related to the current data D[t].

Figure 11:
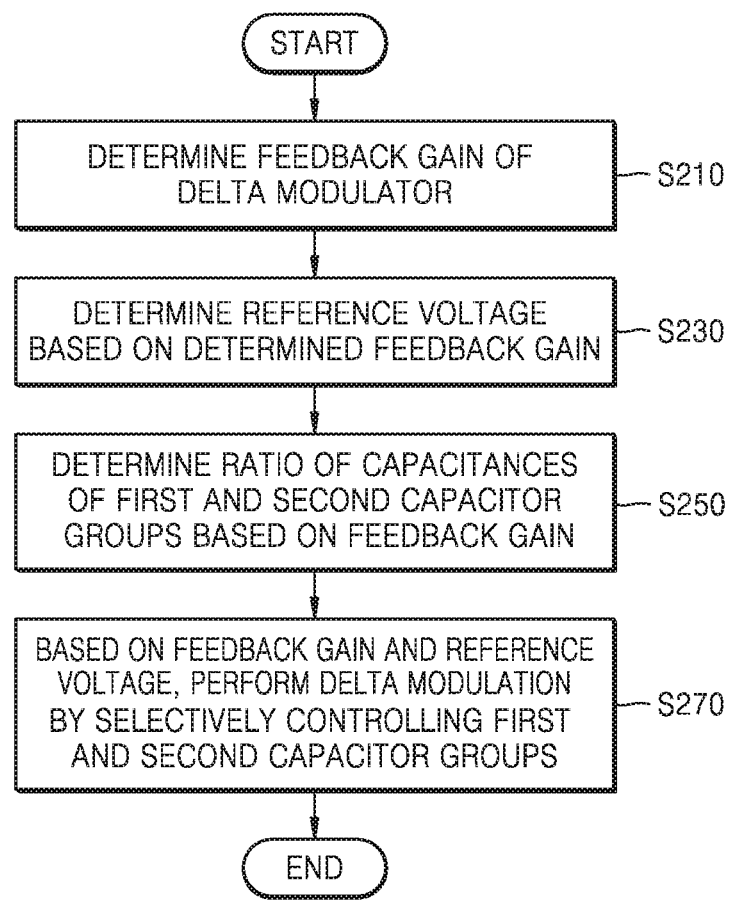
FIG. 11 is a flowchart of a delta modulation method according to an example embodiment.

FIG. 11 is a flowchart of a delta modulation method according to an example embodiment.

Referring to FIG. 11, the delta modulation method according to the present example embodiment is a method of performing the sampling operation and the conversion operation by controlling at least one of the first and second capacitor groups CG1 and CG2 in the sampling phase and the conversion phase, based on the variable feedback gain. The descriptions provided with reference to FIGS. 1 to 9B may be applied to the present example embodiment, and repeated descriptions will be omitted. The delta modulation method according to the present example embodiment may include, for example, operations that are time-serially performed by the delta modulator 100 of FIG. 4. Hereinafter, the delta modulation method will be described with reference to FIGS. 4 and 11.

In operation S210, the feedback gain G of the delta modulator 100 is determined. In operation S230, a reference voltage Vref is determined based on the feedback gain G. The determined reference voltage may be identically applied to the sampling phase and the conversion phase, and accordingly, multiple reference voltage generators are not necessary to embody a delta modulator having a variable feedback gain G. For example, when the feedback gain G is less than or equal to 1, the reference voltage Vref having the first voltage level may be applied to the reference voltage terminal Vrefp, and when the feedback gain G is greater than 1, the reference voltage A·Vref having the second voltage level may be applied to the reference voltage terminal Vrefp.

In operation S250, a ratio of capacitances of the first and second capacitor groups CG1 and CG2 may be determined based on the feedback gain G. A ratio of the first capacitance of the first capacitor group CG1 to the second capacitance of the second capacitor group CG2 may be x:1−x, wherein x may be determined based on the feedback gain G and may be an arbitrary real number between 0 and 1 (i.e., 0<x<1). Thus, x corresponds to the variable feedback gain. For example, when the feedback gain G is less than 1, x may have a value equivalent to the feedback gain G, and when the feedback gain G is greater than 1, x may be a value that is equal to 1 when x and the feedback gain G are multiplied.

In operation S270, based on the feedback gain G and the reference voltage Vref or A·Vref, the first and second capacitor groups CG1 and CG2 are selectively controlled to perform delta modulation. For example, when the feedback gain G is equal to 1, the reference voltage Vref having the first voltage level may be applied to the reference voltage terminal Vrefp. The sampling operation may be performed by providing the previous data D[t−1] to the first and second switch groups SWG1 and SWG2, and the conversion operation may be performed by providing the current data D[t] to the first and second switch groups SWG1 and SWG2. For example, when the feedback gain G is less than 1, the reference voltage Vref having the first voltage level may be applied to the reference voltage terminal Vrefp. The sampling operation may be performed by providing the previous data D[t−1] only to the first switch group SWG1, and the conversion operation may be performed by providing the current data D[t] to the first and second switch groups SWG1 and SWG2. For example, when the feedback gain G is greater than 1, the reference voltage A·Vref having the second voltage level is applied to the reference voltage terminal Vrefp. The sampling operation may be performed by providing the previous data D[t−1] to the first and second switch groups SWG1 and SWG2, and the conversion operation may be performed by providing the current data D[t] only to the first switch group SWG1.

Figure 12:
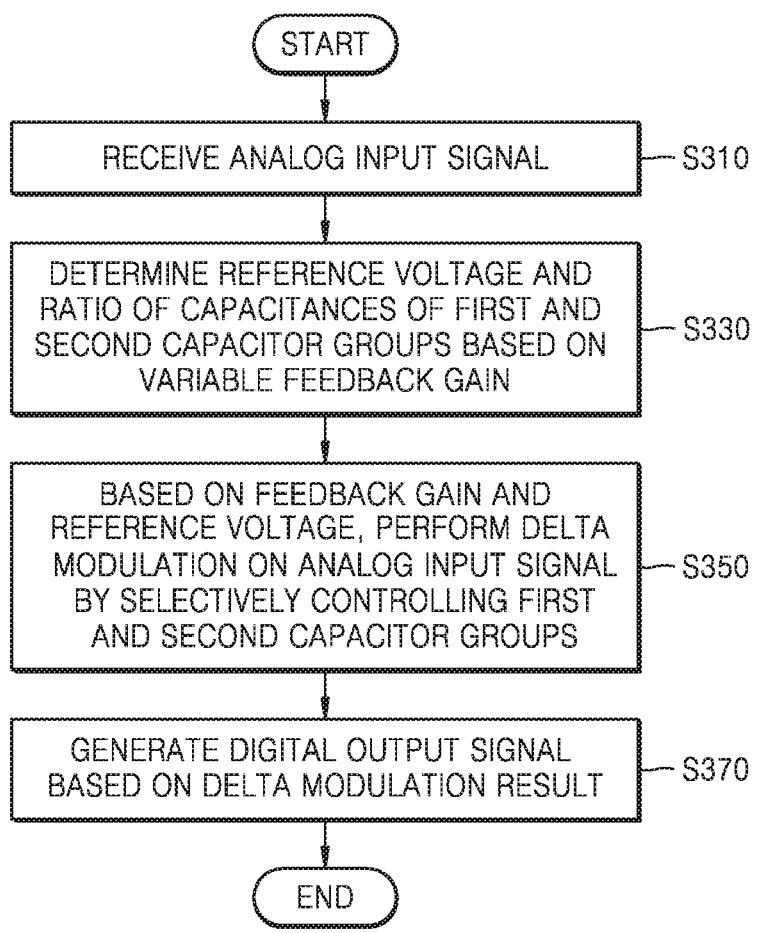
FIG. 12 is a flowchart of an analog-to-digital conversion method according to an example embodiment.

FIG. 12 is a flowchart of an analog-to-digital conversion method according to an example embodiment.

Referring to FIG. 12, the analog-to-digital conversion method according to the present example embodiment is a method of performing an analog-to-digital conversion operation by using a delta modulator having a variable feedback gain. The descriptions provided with reference to FIGS. 1 to 11 may be applied to the present example embodiment, and repeated descriptions are omitted. The analog-to-digital conversion method according to the present example embodiment may include, for example, operations that are time-serially performed by the ADC 10 of FIG. 2. Hereinafter, the analog-to-digital conversion method will be described with reference to FIGS. 2, 4, and 12.

In operation S310, the ADC receives the analog input signal Ain. In operation S330, based on the variable feedback gain G, the reference voltage REF and the ratio of the first and second capacitances of the first and second capacitor groups CG1 and CG2 are determined. When the feedback gain G is less than or equal to 1, the reference voltage REF may be determined as the reference voltage Vref having the first voltage level, and when the feedback gain G is greater than 1, the reference voltage REF may be determined as the reference voltage A·Vref having the second voltage level, wherein A corresponds to the feedback gain G.

In operation S350, based on the determined feedback gain G and reference voltage REF, the first and second capacitor groups CG1 and CG2 are selectively controlled, and thus delta modulation is performed on the analog input signal Ain. For example, when the feedback gain G is equal to 1, the sampling operation may be performed by applying the reference voltage Vref having the first voltage level to the reference voltage terminal Vrefp and providing the previous data D[t−1] to the first and second switch groups SWG1 and SWG2, and the conversion operation may be performed by providing the current data D[t] to the first and second switch groups SWG1 and SWG2. For example, when the feedback gain G is less than 1, the sampling operation may be performed by applying the reference voltage Vref having the first voltage level to the reference voltage terminal Vrefp and providing the previous data D[t−1] only to the first switch group SWG1, and the conversion operation may be performed by providing the current data D[t] to the first and second switch groups SWG1 and SWG2. For example, when the feedback gain G is greater than 1, the sampling operation may be performed by applying the reference voltage A·Vref having the second voltage level to the reference voltage terminal Vrefp and providing the previous data D[t−1] to the first and second switch groups SWG1 and SWG2, and the conversion operation may be performed by providing the current data D[t] only to the first switch group SWG1. In operation S370, the ADC generates the digital output signal Dout based on the delta modulation result.

Figure 13A:
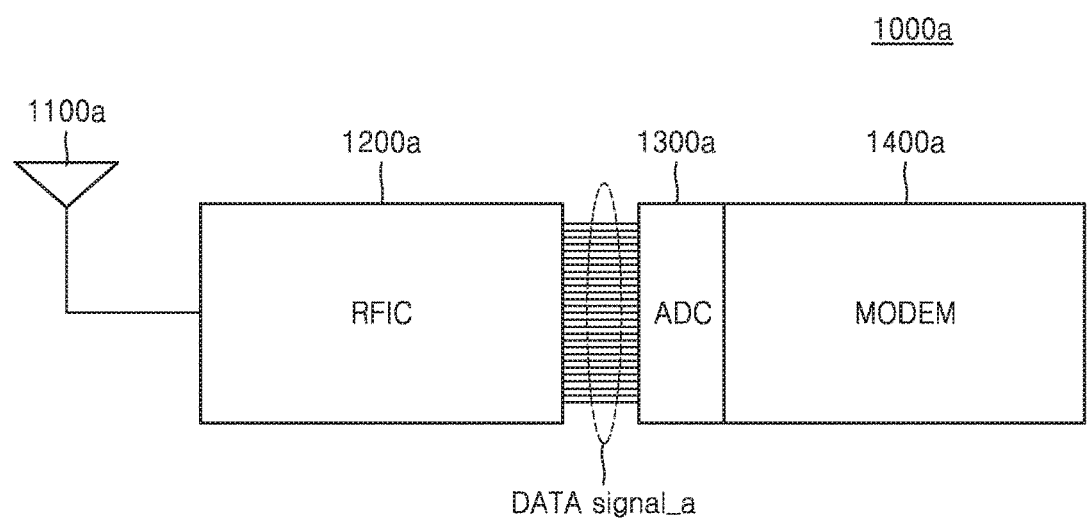
FIGS. 13A and 13B are block diagrams of communication devices according to one or more example embodiments.
Figure 13B:
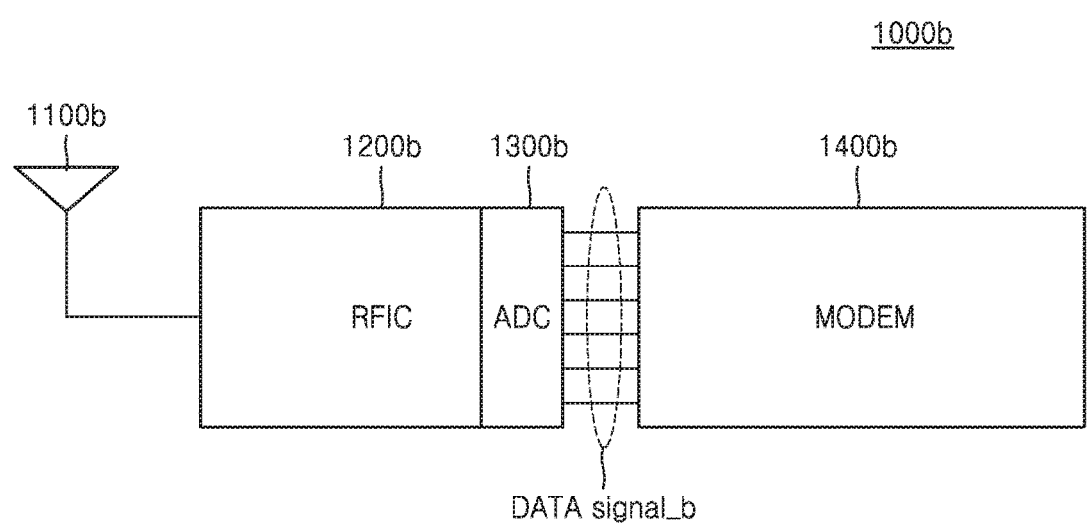

FIGS. 13A and 13B are block diagrams of communication devices 1000a and 1000b according to various example embodiments.

Referring to FIG. 13A, the communication device 1000a may include an antenna 1100a, a radio frequency integrated circuit (RFIC) 1200a, an ADC 1300a, and a modem 1400a. The RFIC 1200a according to the present example embodiment may receive a wireless signal via the antenna 1100a and may decrease a frequency of the wireless signal to a baseband, thereby providing an analog data signal DATA signal_a to the ADC 1300a. The ADC 1300a may convert the analog data signal DATA signal_a into a digital data signal, and the modem 1400a may convert the digital data signal into a data signal that may be processed by an application processor (AP). According to an example embodiment, the ADC 1300a and the modem 1400a may be embodied as a single chip. The single chip including the ADC 1300a and the modem 1400a may be connected to the RFIC 1200a via multiple analog signal lines. Therefore, the single chip according to the present example embodiment may be a modem chip.

Referring to FIG. 13B, unlike the example embodiment of FIG. 13A, an RFIC 1200b and an ADC 1300b may be embodied as a single chip. The single chip including the RFIC 1200b and the ADC 1300b may transmit a digital input signal DATA signal_b to a modem 1400b. The modem 1400b may convert the digital input signal DATA signal_b into a data signal that may be processed by the AP. The single chip including the RFIC 1200b and the ADC 1300b may be connected to the modem 1400b via multiple digital signal lines. Therefore, the single chip according to the present example embodiment may be an RF chip.

When the RFIC 1200b and the ADC 1300b of FIG. 13B are embodied as a single chip, the number of signal lines for transmitting the digital input signal DATA signal_b to the modem 1400b may be less than the number of signal lines for transmitting the analog data signal DATA signal_a of FIG. 13A to the ADC 1300a. However, the present example embodiment is not limited thereto. The RFIC 1200b, the ADC 1300*b*, and the modem 1400*b* may be embodied as a single chip, and furthermore, the RFIC 1200*b*, the ADC 1300*b*, the modem 1400*b*, and the AP may be embodied as a single chip.

Figure 14:
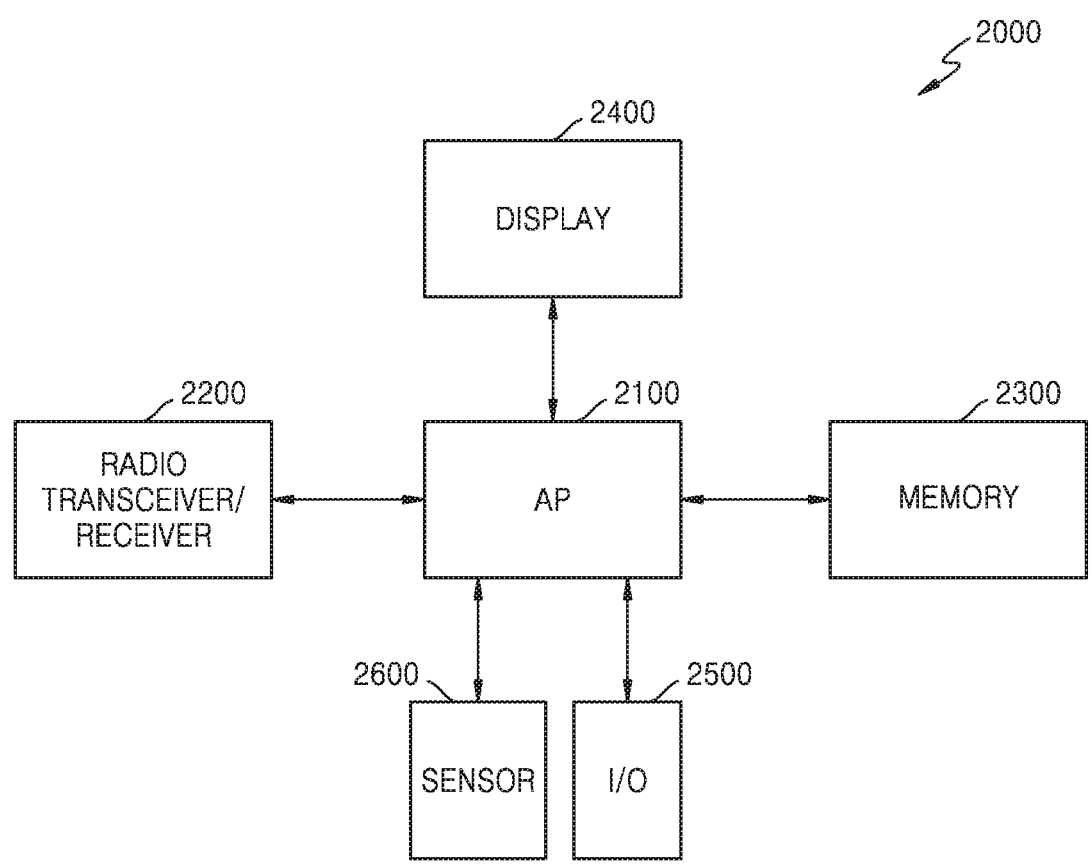
FIG. 14 is a block diagram of an Internet of Things (IoT) device according to an example embodiment.

FIG. 14 is a block diagram of an Internet of Things (IoT) device 2000 according to an example embodiment.

Referring to FIG. 14, the ADC according to one or more example embodiments may be included in the IoT device 2000. IoT may denote a system of internetworking products using wired/wireless communication. An IoT device may have an accessible wired or wireless interface and may exchange data with at least one device via the wired or wireless interface. The accessible wired or wireless interface may include a Local Area Network (LAN), a Wireless Local Area Network (WLAN) such as Wi-Fi, a Wireless Personal Area Network (WPAN) such as Bluetooth, a Wireless Universal Serial Bus (USB), Zigbee, Near Field Communication (NFC), Radio-frequency Identification (RFID), Power Line Communication (PLC), a modem communication interface, e.g., third generation (3G), fourth generation (4G), or Long Term Evolution (LTE), which may access a mobile cellular network. The Bluetooth interface may support Bluetooth Low Energy (BLE).

In particular, the IoT device 2000 may include a communication interface 2200 to communicate with an external device. The communication interface 2200 may be, for example, a wireless short-range communication interface such as a LAN, Bluetooth, Wi-Fi, or Zigbee, or a modem communication interface, e.g., PLC, 3G, or LTE, which may accesses a mobile communication network. The communication interface 2200 may include a transmitter, a receiver or a transceiver (transmitter and receiver). The IoT device 2000 may transmit information to and/or receive information from an access point or a gateway through the communication interface. Also, the IoT device 2000 may transmit and/or receive control information or data of the IoT device 2000 by communicating with a user device or another IoT device.

In the present example embodiment, the receiver of the communication interface 2200 may include an ADC, and the ADC may be embodied according to the descriptions provided with reference to FIGS. 1 to 13B. In particular, the receiver of the communication interface 2200 may include an ADC, and the ADC may include a delta modulator having a variable feedback gain. Based on the variable feedback gain, a reference voltage level applied to the delta modulator may be determined, and a ratio of capacitances of first and second capacitor groups included in the delta modulator may be determined.

The IoT device 2000 may include a processor, such as an AP 2100, for executing an arithmetic operation. The IoT device 2000 may further include a power supply, such as a battery or an external power supply which receives power from an outside source. Also, the IoT device 2000 may include a display 2400 for displaying data, such as an internal state of the IoT device 2000. The user may control the IoT device 2000 via a user interface (UI) of the display 2400. The IoT device 2000 may transmit the internal state and/or data through the transmitter and may receive a control instruction and/or data from the outside through the receiver.

A memory 2300 may store a control instruction code for controlling the IoT device 2000, control data, or user data. The memory 2300 may include at least one of a volatile memory and a non-volatile memory. The non-volatile memory may include at least one of Read Only Memory (ROM), Programmable ROM (PROM), Electrically Programmable ROM (EPROM), Electrically Erasable and Programmable ROM (EEPROM), flash memory, Phase-change random access memory (PRAM), Magnetic RAM (MRAM), Resistive RAM (ReRAM), and Ferroelectric RAM (FRAM). The volatile memory may include at least one of Dynamic RAM (DRAM), Static RAM (SRAM), and Synchronous DRAM (SDRAM).

The IoT device 2000 may further include a storage device. The storage device may be a non-volatile medium such as hard disk drive (HDD), Solid State Disk (SSD), an embedded Multi Media Card (eMMC), or Universal Flash Storage (UFS). The storage device may store user information provided via an input/output device 2500 and sensing information collected through a sensor 2600.

While aspects of example embodiments have been particularly shown and described with reference to the example embodiments, it will be understood that various changes in form and details may be made therein without departing from the spirit and scope of the following claims.

What is claimed is:

1. A delta modulator comprising:
a capacitor group comprising a plurality of capacitors that are commonly connected to a first terminal, wherein the plurality of capacitors are respectively classified into a first capacitor group and a second capacitor group such that the delta modulator has a variable feedback gain;
a comparator configured to sequentially generate n-bit digital output signals based on a first terminal voltage of the first terminal, wherein n is a positive integer; and
a switch group comprising a plurality of switches that are respectively connected to the plurality of capacitors, wherein the plurality of switches are respectively classified into a first switch group and a second switch group that are respectively connected to the first capacitor group and the second capacitor group, and the first switch group and the second switch group are configured to respectively operate according to a first control signal and a second control signal, the first control signal being determined based on the n-bit digital output signals and the second control signal being determined based on the n-bit digital output signals and the variable feedback gain,
wherein the first control signal corresponds to n-bit previous data in a sampling phase, and corresponds to n-bit current data that is sequentially output in a conversion phase,
wherein the second control signal corresponds to the n-bit previous data in the sampling phase when the variable feedback gain is not less than one, and corresponds to the n-bit current data in the conversion phase when the variable feedback gain is not greater than one.

2. The delta modulator of claim 1, wherein each of the plurality of switches is configured to selectively connect a corresponding capacitor of the plurality of capacitors to a reference voltage terminal and a ground voltage terminal according to the first control signal and the second control signal, and
wherein a reference voltage level applied to the reference voltage terminal remains uniform in the sampling phase and the conversion phase.

3. The delta modulator of claim 2, wherein the reference voltage level is a first voltage level in response to the variable feedback gain being less than or equal to one, and
wherein the reference voltage level is a second voltage level corresponding to the first voltage level multiplied by the variable feedback gain in response to the variable feedback gain being greater than one.

4. The delta modulator of claim 1, wherein a ratio of a first capacitance of the first capacitor group to a second capacitance of the second capacitor group is x:(1−x), wherein x corresponds to the variable feedback gain.

5. The delta modulator of claim 4, wherein the variable feedback gain multiplied by x corresponds to 1 in response to the variable feedback gain being greater than one, and
wherein x corresponds to the variable feedback gain in response to the variable feedback gain being less than one.

6. The delta modulator of claim 1, wherein the first control signal and the second control signal are identical to each other as the n-bit previous data in the sampling phase in response to the variable feedback gain being greater than one, and
wherein the first control signal is the n-bit current data that is sequentially output and the second control signal is reset data that is not related to the n-bit current data in the conversion phase.

7. The delta modulator of claim 1, wherein the first control signal is the n-bit previous data and the second control signal is reset data that is not related to the n-bit previous data in the sampling phase in response to the variable feedback gain being less than one, and
wherein the first control signal and the second control signal are identical to each other as the n-bit current data that is sequentially output in the conversion phase.

8. The delta modulator of claim 1, wherein the first control signal is identical to the second control signal as the n-bit previous data in the sampling phase in response to the variable feedback gain being equal to one, and
wherein the first control signal is identical to the second control signal as the n-bit current data that is sequentially output in the conversion phase.

9. The delta modulator of claim 1, further comprising an input switch between the first terminal and an input terminal, the input terminal being configured to receive an analog input voltage,
wherein the input switch is configured to turn on in the sampling phase and turn off in the conversion phase.

10. The delta modulator of claim 1, further comprising a digital logic configured to:
sequentially receive the n-bit digital output signals from the comparator;
generate the first control signal and the second control signal; and
respectively provide the first control signal and the second control signal, as generated, to the first switch group and the second switch group.

11. An analog-to-digital converter configured to convert an analog input signal into a digital output signal, the analog-to-digital converter comprising:
a delta modulator configured to receive the analog input signal in a sampling phase and output the digital output signal in a conversion phase, the delta modulator having a variable feedback gain,
wherein the delta modulator comprises:
a capacitor group comprising a plurality of capacitors that are commonly connected to a first terminal, wherein the plurality of capacitors are respectively classified into a first capacitor group and a second capacitor group such that the delta modulator has the variable feedback gain;
a comparator configured to sequentially generate the digital output signal based on a voltage of the first terminal, the digital output signal having n bits, wherein n is a positive integer; and
a switch group comprising a plurality of switches respectively connected to the plurality of capacitors, wherein the plurality of switches are respectively classified into a first switch group and a second switch group that are respectively connected to the first capacitor group and the second capacitor group, and the first switch group and the second switch group are configured to respectively operate according to a first control signal and a second control signal, the first control signal being determined based on the n-bit digital output signals and the second control signal being determined based on the n-bit digital output signals and the variable feedback gain,
wherein the first control signal corresponds to n-bit previous data in the sampling phase, and corresponds to n-bit current data that is sequentially output in the conversion phase,
wherein the second control signal corresponds to the n-bit previous data in the sampling phase when the variable feedback gain is not less than one, and corresponds to the n-bit current data in the conversion phase when the variable feedback gain is not greater than one.

12. The analog-to-digital converter of claim 11, wherein the delta modulator further comprises an input switch configured to receive the analog input signal and provide the analog input signal to the first terminal in the sampling phase.

13. The analog-to-digital converter of claim 11, wherein the delta modulator further comprises a digital logic configured to:
sequentially receive the digital output signal from the comparator;
generate the first control signal and the second control signal; and
respectively provide the first control signal and the second control signal, as generated, to the first switch group and the second switch group.

14. The analog-to-digital converter of claim 11, wherein each of the plurality of switches is configured to selectively connect a corresponding capacitor of the plurality of capacitors to a reference voltage terminal and a ground voltage terminal according to the first control signal and the second control signal, and
wherein a reference voltage level applied to the reference voltage terminal remains uniform in the sampling phase and the conversion phase.

15. The analog-to-digital converter of claim 14, wherein the reference voltage level is a first voltage level in response to the variable feedback gain being less than or equal to one, and
wherein the reference voltage level is a second voltage level corresponding to the first voltage level multiplied by the variable feedback gain in response to the variable feedback gain is greater than one.

16. The analog-to-digital converter of claim 11, wherein a ratio of a first capacitance of the first capacitor group to a second capacitance of the second capacitor group is x:(1−x), and
wherein x corresponds to the variable feedback gain.

17. A delta modulator comprising:
a first capacitor group comprising a first plurality of capacitors commonly connected to a first terminal;
a second capacitor group comprising a second plurality of capacitors commonly connected to the first terminal;

a first switch group comprising a first plurality of switches which respectively correspond to the first plurality of capacitors;

a second switch group comprising a second plurality of switches which respectively correspond to the second plurality of capacitors;

a first controller configured to generate, based on a first n-bit digital output signal, a first control signal configured to control the first switch group and a second control signal configured to control the second switch group; and a comparator configured to sequentially generate the first n-bit digital output signal based on a first voltage level of the first terminal, wherein the first control signal corresponds to n-bit previous data in a sampling phase, and corresponds to n-bit current data that is sequentially output in a conversion phase, wherein the second control signal corresponds to the n-bit previous data in the sampling phase when a variable feedback gain is not less than one, and corresponds to the n-bit current data in the conversion phase when the variable feedback gain is not greater than one, and wherein n is a positive integer.

18. The delta modulator of claim 17, further comprising:

a third capacitor group comprising a third plurality of capacitors commonly connected to a second terminal;

a fourth capacitor group comprising a fourth plurality of capacitors commonly connected to the second terminal;

a third switch group comprising a third plurality of switches which respectively correspond to the third plurality of capacitors;

a fourth switch group comprising a fourth plurality of switches which respectively correspond to the fourth plurality of capacitors; and a second controller configured to generate, based on a second n-bit digital output signal, a third control signal configured to control the third switch group and a fourth control signal configured to control the fourth switch group, wherein the comparator is further configured to sequentially generate the second n-bit digital output signal based on a second voltage level of the second terminal.

19. The delta modulator of claim 18, further comprising a first input switch configured to receive a first analog input signal and provide the first analog input signal to the first terminal in the sampling phase; and a second input switch configured to receive a second analog input signal and provide the second analog input signal to the second terminal in the sampling phase.

20. The delta modulator of claim 19, wherein the first analog input signal is a negative input voltage, wherein the second analog input signal is a positive input voltage, and wherein the comparator is a differential comparator.

* * * * *